(12) United States Patent
Dheeraj et al.

(10) Patent No.: US 11,594,657 B2
(45) Date of Patent: Feb. 28, 2023

(54) NANOWIRES/NANOPYRAMIDS SHAPED LIGHT EMITTING DIODES AND PHOTODETECTORS

(71) Applicants: CRAYONANO AS, Trondheim (NO); NORWEGIAN UNIVERSITY OF SCIENCE AND TECHNOLOGY (NTNU), Trondheim (NO)

(72) Inventors: Dasa L. Dheeraj, Trondheim (NO); Dong Chul Kim, Trondheim (NO); Bjørn Ove M. Fimland, Trondheim (NO); Helge Weman, Ecublens (CH)

(73) Assignees: CRAYONANO AS, Trondheim (NO); NORWEGIAN UNIVERSITY OF SCIENCE AND TECHNOLOGY (NTNU), Trondheim (NO)

(*) Notice: Subject to any disclaimer, the term of this patent is extended or adjusted under 35 U.S.C. 154(b) by 0 days.

(21) Appl. No.: 15/744,467

(22) PCT Filed: Jul. 13, 2016

(86) PCT No.: PCT/EP2016/066694
§ 371 (c)(1),
(2) Date: Jan. 12, 2018

(87) PCT Pub. No.: WO2017/009394
PCT Pub. Date: Jan. 9, 2017

(65) Prior Publication Data
US 2018/0204977 A1 Jul. 19, 2018

(30) Foreign Application Priority Data

Jul. 13, 2015 (GB) .................................. 1512231
Jan. 5, 2016 (GB) .................................. 1600164

(51) Int. Cl.
H01L 31/105 (2006.01)
H01L 33/08 (2010.01)
(Continued)

(52) U.S. Cl.
CPC ...... H01L 33/08 (2013.01); H01L 31/035227 (2013.01); H01L 31/105 (2013.01);
(Continued)

(58) Field of Classification Search
CPC ............ H01L 33/08; H01L 31/035227; H01L 31/1035; H01L 31/105; H01L 31/184
See application file for complete search history.

(56) References Cited

U.S. PATENT DOCUMENTS 4,213,801 A 7/1980 Johnston
7,335,908 B2 * 2/2008 Samuelson ............. C30B 11/00
257/12

(Continued)

FOREIGN PATENT DOCUMENTS

CN 101504961 A 8/2009
CN 101710567 A 5/2010
(Continued)

OTHER PUBLICATIONS

Non-Final Office Action dated Jul. 5, 2018 in related U.S. Appl. No. 15/744,457.
(Continued)

Primary Examiner — Mounir S Amer
Assistant Examiner — Alexander Belousov
(74) Attorney, Agent, or Firm — Meunier Carlin & Curfman LLC

(57) ABSTRACT

A light emitting diode device comprising: a plurality of nanowires or nanopyramids grown on a graphitic substrate, said nanowires or nanopyramids having a p-n or p-i-n junction, a first electrode in electrical contact with said (Continued)

graphitic substrate; a light reflective layer in contact with the top of at least a portion of said nanowires or nanopyramids, said light reflective layer optionally acting as a second electrode; optionally a second electrode in electrical contact with the top of at least a portion of said nanowires or nanopyramids, said second electrode being essential where said light reflective layer does not act as an electrode; wherein said nanowires or nanopyramids comprise at least one group III-V compound semiconductor; and wherein in use light is emitted from said device in a direction substantially opposite to said light reflective layer.

27 Claims, 8 Drawing Sheets

(51) Int. Cl.
| | | |
|---|---|---|
| H01L 31/0352 | (2006.01) | |
| H01L 33/24 | (2010.01) | |
| H01L 33/06 | (2010.01) | |
| H01L 33/18 | (2010.01) | |
| H01L 31/103 | (2006.01) | |
| H01L 31/18 | (2006.01) | |
| H01L 33/32 | (2010.01) | |

(52) U.S. Cl.
CPC ........ *H01L 31/1035* (2013.01); *H01L 31/184* (2013.01); *H01L 31/1852* (2013.01); *H01L 33/06* (2013.01); *H01L 33/18* (2013.01); *H01L 33/24* (2013.01); *H01L 33/325* (2013.01)

(56) References Cited

U.S. PATENT DOCUMENTS

| | | | |
|---|---|---|---|
| 7,442,575 | B2 | 10/2008 | Coffer et al. |
| 7,594,982 | B1 | 9/2009 | Sager et al. |
| 7,608,147 | B2 | 10/2009 | Samuelson et al. |
| 7,608,472 | B2 | 10/2009 | Ichinose et al. |
| 7,911,035 | B2 | 3/2011 | Seifert et al. |
| 7,965,960 | B2 | 6/2011 | Kim et al. |
| 8,043,942 | B2 | 10/2011 | Lee et al. |
| 8,212,335 | B2 | 7/2012 | Fujioka |
| 8,417,153 | B2 | 4/2013 | Kim et al. |
| 8,440,350 | B1 | 5/2013 | Verbrugge et al. |
| 8,455,284 | B2 | 6/2013 | Seong et al. |
| 8,916,850 | B2 | 12/2014 | Yi et al. |
| 9,577,176 | B1 * | 2/2017 | Fong ............... H01L 31/03044 |
| 9,666,673 | B2 | 5/2017 | Yi et al. |
| 9,978,808 | B2 | 5/2018 | Schneider, Jr. et al. |
| 10,347,781 | B2 | 7/2019 | Weman et al. |
| 2002/0175408 | A1 | 11/2002 | Majumdar et al. |
| 2003/0044608 | A1 | 3/2003 | Yoshizawa et al. |
| 2005/0217565 | A1 * | 10/2005 | Lahreche .......... H01L 21/76248 117/84 |
| 2006/0054909 | A1 * | 3/2006 | Shin ................. H01L 33/405 257/98 |
| 2006/0125056 | A1 | 6/2006 | Samuelson et al. |
| 2006/0188774 | A1 | 8/2006 | Niu et al. |
| 2007/0177138 | A1 | 8/2007 | Esmaeili |
| 2007/0177139 | A1 | 8/2007 | Kamins et al. |
| 2007/0212538 | A1 | 9/2007 | Niu |
| 2007/0240757 | A1 | 10/2007 | Ren et al. |
| 2008/0036038 | A1 * | 2/2008 | Hersee ............... B82Y 20/00 257/615 |
| 2008/0081439 | A1 | 4/2008 | Coffer et al. |
| 2008/0118999 | A1 | 5/2008 | Komada |
| 2008/0142066 | A1 | 6/2008 | Plissonnier et al. |
| 2008/0142926 | A1 | 6/2008 | Seifert et al. |
| 2008/0191317 | A1 | 8/2008 | Cohen et al. |
| 2009/0057649 | A1 | 3/2009 | Sutter et al. |
| 2009/0159907 | A1 | 6/2009 | Wang |
| 2009/0176159 | A1 | 7/2009 | Zhamu et al. |
| 2009/0191317 | A1 | 7/2009 | Lin |
| 2009/0200540 | A1 | 8/2009 | Bjoerk et al. |
| 2009/0235862 | A1 | 9/2009 | Cha et al. |
| 2009/0293946 | A1 | 12/2009 | Lin et al. |
| 2010/0029037 | A1 | 2/2010 | Tokuda et al. |
| 2010/0035412 | A1 | 2/2010 | Samuelson et al. |
| 2010/0155702 | A1 | 6/2010 | Wernersson et al. |
| 2010/0171096 | A1 | 7/2010 | Sutter et al. |
| 2010/0200839 | A1 | 8/2010 | Okai et al. |
| 2010/0252808 | A1 | 10/2010 | Samuelson et al. |
| 2010/0314617 | A1 | 12/2010 | Ito et al. |
| 2010/0320445 | A1 | 12/2010 | Ogihara et al. |
| 2010/0327258 | A1 | 12/2010 | Lee et al. |
| 2011/0030772 | A1 | 2/2011 | Veerasamy |
| 2011/0030991 | A1 | 2/2011 | Veerasamy et al. |
| 2011/0081500 | A1 | 4/2011 | Zhao et al. |
| 2011/0121264 | A1 | 5/2011 | Choi et al. |
| 2011/0129675 | A1 | 6/2011 | Choi et al. |
| 2011/0133061 | A1 | 6/2011 | Yu et al. |
| 2011/0148284 | A1 | 6/2011 | Nagao et al. |
| 2011/0163292 | A1 | 7/2011 | Wang et al. |
| 2011/0168256 | A1 | 7/2011 | Wang et al. |
| 2011/0174626 | A1 | 7/2011 | Hamada et al. |
| 2011/0175059 | A1 | 7/2011 | Kahen et al. |
| 2011/0177683 | A1 | 7/2011 | Kahen et al. |
| 2011/0203651 | A1 | 8/2011 | Nagao et al. |
| 2011/0220171 | A1 | 9/2011 | Mathai et al. |
| 2011/0220864 | A1 | 9/2011 | Kim et al. |
| 2011/0239932 | A1 | 10/2011 | Chang et al. |
| 2011/0240099 | A1 | 10/2011 | Ellinger et al. |
| 2011/0254034 | A1 | 10/2011 | Konsek et al. |
| 2011/0272723 | A1 | 11/2011 | Ha et al. |
| 2011/0313194 | A1 | 12/2011 | Lee et al. |
| 2012/0021554 | A1 | 1/2012 | Neel et al. |
| 2012/0041246 | A1 | 2/2012 | Scher et al. |
| 2012/0056237 | A1 | 3/2012 | Choi et al. |
| 2012/0068122 | A1 | 3/2012 | Kranbuehl et al. |
| 2012/0068153 | A1 * | 3/2012 | Seong ............... H01L 33/16 257/13 |
| 2012/0068157 | A1 | 3/2012 | Kub et al. |
| 2012/0087422 | A1 | 4/2012 | Zhou et al. |
| 2012/0090057 | A1 | 4/2012 | Cohen et al. |
| 2012/0132930 | A1 | 5/2012 | Young et al. |
| 2012/0135158 | A1 | 5/2012 | Freer et al. |
| 2012/0141799 | A1 * | 6/2012 | Kub ................... B82Y 30/00 428/408 |
| 2012/0145549 | A1 | 6/2012 | Cho et al. |
| 2012/0192931 | A1 | 8/2012 | Jeon et al. |
| 2012/0211073 | A1 | 8/2012 | Nagao et al. |
| 2012/0241192 | A1 | 9/2012 | Cai et al. |
| 2012/0270054 | A1 | 10/2012 | Hong et al. |
| 2013/0026468 | A1 | 1/2013 | Yoshimuta et al. |
| 2013/0137220 | A1 | 5/2013 | Matsubara et al. |
| 2013/0153860 | A1 | 6/2013 | Kim et al. |
| 2013/0158322 | A1 | 6/2013 | Nyce et al. |
| 2013/0187128 | A1 * | 7/2013 | Yi ..................... B82Y 20/00 257/13 |
| 2013/0207075 | A1 | 8/2013 | Myers et al. |
| 2013/0213470 | A1 * | 8/2013 | Yi ..................... B82Y 10/00 136/256 |
| 2013/0221322 | A1 | 8/2013 | Ohlsson et al. |
| 2013/0221385 | A1 | 8/2013 | Shibata et al. |
| 2013/0231470 | A1 | 9/2013 | Iacobelli |
| 2013/0280894 | A1 | 10/2013 | Lee et al. |
| 2013/0311363 | A1 | 11/2013 | Ramaci et al. |
| 2013/0334497 | A1 * | 12/2013 | Weman ............... B82Y 40/00 257/26 |
| 2014/0014171 | A1 | 1/2014 | Alam et al. |
| 2014/0077156 | A1 | 3/2014 | Bavencove et al. |
| 2014/0080234 | A1 | 3/2014 | Lin et al. |
| 2014/0151826 | A1 | 6/2014 | Keiber et al. |
| 2014/0161730 | A1 | 6/2014 | Sitharaman et al. |
| 2014/0182668 | A1 | 7/2014 | Pacifici et al. |
| 2014/0231745 | A1 | 8/2014 | Northrup et al. |
| 2014/0252316 | A1 | 9/2014 | Yan et al. |
| 2014/0293164 | A1 | 10/2014 | Kim et al. |
| 2015/0014631 | A1 * | 1/2015 | Ohlsson ............. H01L 21/0237 257/24 |

(56) References Cited

U.S. PATENT DOCUMENTS

| | | | |
|---|---|---|---|
| 2015/0076450 A1 | 3/2015 | Weman et al. | |
| 2015/0194549 A1* | 7/2015 | Weman | H01L 31/022466 136/244 |
| 2015/0255677 A1 | 9/2015 | Dechoux et al. | |
| 2015/0311363 A1 | 10/2015 | Park et al. | |
| 2016/0005751 A1 | 1/2016 | Tsui et al. | |
| 2016/0013365 A1* | 1/2016 | Chun | H01L 33/007 438/34 |
| 2018/0158913 A1* | 6/2018 | Withers | H05B 33/145 |

FOREIGN PATENT DOCUMENTS

| | | |
|---|---|---|
| CN | 102254969 A | 11/2011 |
| CN | 102376817 | 3/2012 |
| CN | 103050498 A | 4/2013 |
| CN | 103903973 A | 7/2014 |
| EP | 1829141 | 9/2007 |
| EP | 1952467 | 8/2008 |
| EP | 2267796 A2 | 12/2010 |
| GB | 2517186 | 2/2015 |
| JP | 2002280610 A | 9/2002 |
| JP | 2007051327 A | 3/2007 |
| JP | 2009010012 A | 1/2009 |
| JP | 2012250868 A | 12/2012 |
| JP | 2013129548 A | 7/2013 |
| JP | 2014120548 | 6/2014 |
| KR | 20090003840 | 1/2009 |
| KR | 20100094228 A | 8/2010 |
| KR | 20110061492 A | 6/2011 |
| KR | 20120035841 | 4/2012 |
| KR | 20120083084 | 7/2012 |
| KR | 20120092431 | 8/2012 |
| KR | 101517551 | 5/2015 |
| WO | 2006062947 | 6/2006 |
| WO | 2007061945 | 4/2009 |
| WO | 2010056064 | 5/2010 |
| WO | 2010056061 | 8/2010 |
| WO | 2010096035 | 8/2010 |
| WO | 2011016837 | 2/2011 |
| WO | 2011081440 | 7/2011 |
| WO | 2011090863 | 7/2011 |
| WO | 2011160051 A2 | 12/2011 |
| WO | 2012029381 | 3/2012 |
| WO | 2012080252 | 6/2012 |
| WO | 2013104723 | 7/2013 |
| WO | 2013121289 | 8/2013 |
| WO | 2013190128 | 12/2013 |
| WO | 2014202796 | 12/2014 |
| WO | 2015022414 A1 | 2/2015 |

OTHER PUBLICATIONS

Pela et al. "Accurate band gaps of AlGaN, InGaN, and AlInN alloys calculations based on LDA-1/2 approach." Appl Phys Lett, 2011,98, 151907.
Non-Final Office Action dated Dec. 31, 2018 in U.S. Appl. No. 15/749,228 (14 pages).
Restriction Requirement dated Sep. 26, 2018 in related U.S. Appl. No. 15/749,228.
Notice of Allowanced dated Oct. 30, 2018 in U.S. Appl. No. 14/371,621 (9 pages).
Bonaccorsco et al., Graphene photonics and optoelectronics, Nature Photonics, 2010, 4, 611.
Boukhvalov et al., Chemical functionalization of graphene with defects, Nano Letters, 2008, 8(12), 4373-4379.
Chung et al., Transferable GaN Layers Grown on ZnO-Coated Graphene Lyers for Optoelectronic Devices, Science, 2010, 330, 655-657.
Cohin et al. Growth of Vertical GaAs Nanowires on an Amorphous Substrate via a Fiber-Textured Si Platform, Nano letters 2013, 13, 2743.
Colombo et al., Ga-assisted catalyst-free growth mechanism of GaAs nanowires by molecular beam epitaxy, Phys Rev B, 2008, 77, 155326.
Dheeraj et al., Controlling crystal phases in GaAs nanowires grown by Au-assisted molecular beam epitaxy, Nanotechnology, 2013, 24, 015601.
Gao et al., Repeated growth and bubbling transfer of graphene with millimetre-size single-crystal grains using platinum, Nat Commun 2012, 3, 699.
Heib et al., Growth mechanisms and optical properties of GaAs-based semiconductor microstructures by selective area epitaxy, Journal of Crystal Growth, 2008, 310, 1049-1056.
Hong et al., Controlled can der Waals Heteroepitaxy of InAs Nanowires on Carbon Honeycomb Lattices, ACS Nano, 2011, 5(9), 7576-7584.
Huh et al., UV/Ozone-Oxidized Large-Scale Graphene Platform with Large Chemical Enhancement in Surface-Enhanced Raman Scattering, ACS Nano, 2011, 5(12), 9799-9806.
Kent et al., Deep ultraviolet emitting polarization induced nanowire light emitting diods with AlxGa(1-x)N active regions, Nanotechnology, 2014, 25, 455201.
Kim et al., Realization of a high mobility dual-gated graphene field-effect transistor with Al2O3 dielectric, Appl. Phys. Lett. 2009, 94, 062107.
Kim et al., Vertically aligned ZnO nanostructures grown on graphene layers, Applied Physics Letters, 2009, 95, 213101-1 through 213101-3.
Kishino et al., Improved Ti-mask selective-area growth (SAG) by rf-plasma-assisted molecular beam epitaxy demonstrating extremely uniform GaN nanocolumn arrays, J. Crystal Growth 2009, 311, 2063-68.
Kneissl, Advances in group III-nitride-based deep UV light-emitting diode technology, Semiconductor Sci and Tech, 2011, 26, 014036.
Mariani et al., Patterned radial GaAs nanopillar solar cells, Nano Letters, 2011, 11, 2490-2494.
Marzouki et al., Structural and optical characterizations of nitrogen doped ZnO nanowires grown by MOCVD, Materials Letters, 2010, 64, 2112-2114.
Mohseni et al., Hybrid GaAs-Nanowire Carbon-Nanotube Flexible Photovoltaics, IEEE Journal of Selected Topics in Quantum Electronics, 201, 17(4), 1070-1077.
Mulyana et al., Reversible Oxidation of Graphene Through Ultraviolet/Ozone Treatment and Its Nonthermal Reduction through Ultraviolet Irradiation, J Phys Chem C, 2014, 118(47), 27372-27381.
Mulyana et al., Thermal reversibility in electrical characteristics of ultraviolet/ozone-treated graphene, Applied Physics Letters, 2013, 103, 063107.
Munshi et al., Position-Controlled Uniform GaAs Nanowires on Silicon using Nanoimprint Lithography, Nano Letters, 2014, 14, 960-966.
Musolino et al. Compatibility of the selective area growth of GaN nanowires on AlN-buffered Si substrates with the operation of light emitting diodes. Nanotechnology 2015, 26, 085605.
Nevidomskyy et al., Chemically active substitutional nitrogen impurity in carbon nanotubes, Phys Rev Lett, 91, 105502.
Nistor et al., The role of chemistry in graphene doping for carbon-based electronics, ACS Nano, 2011, 5(4), 3096-3103.
Paek et al., MBE-VLS growth of GaAs nanowires on (111)Si substrate, Physica Status Solidi (C), 2008, 5(9), 2740-2742.
Park et al., Inorganic nanostructures grown on graphene layers, Nanoscale, 2011, 3(9), 3522-3533.
Patsha et al., Growth of GaN nanostructures on graphene, Nanoscience, 2011 International Conference on Enginieering and Technology (ICONSET), pp. 553-555.
Peng et al., Control of growth orientation of GaN nanowires, Chemical Physics Letters, 2002, 359, 241-245.
Pierret et al., Generic nanp-imprint process for fabrication of nanowire arrays, Nanotechnology, 21(6), 065305.
Plissard et al., Gold-free growth of GaAs nanowires on silicon: arrays and polytypism, Nanotechnology, 2010, 21, 1-8.

(56) References Cited

OTHER PUBLICATIONS

Plissard et al., High yield of self-catalyzed GaAs nanowire arrays grown on silicon via gallium droplet positioning, Nanotechnology, 2011, 22, 275602.
Sun et al., Compounds Semiconductor Nanowire Solar Cells, IEEE Journal of Selected Topics in Quantum Electronics, 2011, 17)(4), 1033-1049.
Toko et al. Selective formation of large-grained (100)- or (111)-oreinted Si on glass by Al-induced layer exchange. J Appl Phys, 2014, 115, 094301.
Tomioka et al., Control of InAs Nanowire Growth Directions on Si, Nano Letters, 2008, 8(10), 3475-3480.
Wang et al., Growth of Nanowires, Materials Science and Engineering, 2008, 60, 1-51.
Wang et al., Nanocrystal growth on graphene in various degrees of oxidation, Journal of American Chemical Society, 2010, 132, 3270-3271.
Yamaguchi et al., Passivating chemical vapor deposited graphene with metal oxides for transfer and transistor fabrication processes, Appl Phys Lett, 2013, 102, 143505.
Yin et al., Application of CVD graphene as transparent front electrode in Cu(In, GA)Se2 solar cell, 2014 IEEE 40th Photovoltaic Specialist Conference (PVSC), pp. 1740-1744, XP032660257.
Yoon et al., Vertical epitaxial Co5Ge7 nanowires and nanobelt arrays on a thin graphitic Tayer for flexible Field Emission Displays, Advanced Materials, 2009, 21, 4979-4982.
Yu et al., Electronic properties of nitrogen-atom-adsorbed graphene nanoribbons with armchair edges, IEEE transactions on Nanotechnology, 2010, 9(2).
Zhao et al., Aluminum nitride nanowire light emitting diodes: Breaking the fundamental bottleneck of deep ultraviolet light sources, Scientific Reports, 2015, 5, 8332.
International Search Report and Written Opinion dated Oct. 19, 2016 in related application PCT/EP2016/066694 (13 pages).
International Search Report and Written Opinion dated Oct. 14, 2016 in related application PCT/EP2016/006696 (11 pages).
International Search Report and Written Opinion dated Jan. 11, 2017 in related application PCT/EP2016/068350 (16 pages).
Final Office Action dated Aug. 13, 2019 in U.S. Appl. No. 15/749,228 (12 pages).

Nayak, B.B. et al., "Surface nitriding of graphite substrate by plasma focus device towards synthesis of carbon nitride coating", Surface and Coating Technology 145 (2001 ), pp. 8-15.) (Year: 2001), 2001.
Nayak, et al., "Surface nitriding of graphite substrate by plasma focus device towards synthesis of carbon nitride coating", Surface and Coatings Technology, 2001, 145, 8-15.
Non Final Office Action dated Dec. 4, 2019 in U.S. Appl. No. 15/749,228.
Notice of Allowance dated Mar. 25, 2020 in U.S. Appl. No. 15/749,228.
Non-Final Office Action dated Apr. 1, 2020 in U.S. Appl. No. 16/504,862.
"Nanocomposite Thin Films and Coatings-Processing, Properties, Performance, Table 2.1. The Physical, Mechanical and Thermal Properties of Hard Materials, 2007, World Scientific."
Jiang, Yeping et al., "Fermi-Level Tuning of Epitaxial Sb2Te3 Thin Films on Graphene by Regulating Intrinsic Defects and Substrate Transfer Doping", Physical Review Letters, 2012, 108:066809.
Munshi, et al., "Vertically aligned GaAs nanowires on graphite and few-layer graphene: Generic model epitaxial growth", Nano Letters 2012, 12(9): 4570-4573.
Park, et al., "Hybrid Semiconductor Nanostructures with Graphene Layers", 2012, Chapter 6.
Park, Jun Beom et al., "Metal catalyst-assisted growth of GaN nanowires on graphene films for flexible photocatalyst applications", Current Applied Physics, 2014, 14, 1437-1442.
Vrojanadara, et al., "Large homogeneous mono-/bi-ayer graphene on 6H-SiC (0001) and buffer layer elimination", J Phys D: Appl Phys. 2010, 43, 374010.
Yoo, et al., "Microstructural defects in GaN thin films grown on chemically vapor-deposited graphene layers", Applied Physics Letters 2013, 102 (5): 051908-1-051908-3.
Kind, H et al., Nanowire Ultraviolet Photodetectors and Optical Switches, Advanced Materials, 2002, 14(2), 158-160.
Lee, Chul-Ho et al., "Flexible Inorganic Nanostructure Light-Emitting Diodes Fabricated on Graphene Films," Advanced Materials, 2011, 23, 4614-4619.
Tateno, K. et al., "VLS Growth of III-V Semiconductor Nanowires on Graphene Layers," MRS Online Proceedings, 2012, 1439, 45-50, XP002732679.

* cited by examiner

NANOWIRES/NANOPYRAMIDS SHAPED LIGHT EMITTING DIODES AND PHOTODETECTORS

This invention concerns the use of a thin graphitic layer as a transparent substrate for the growth of nanowires or nanopyramids which can be formed into LEDs and photodetectors e.g. for the emission or detection of light in the visible or UV spectrum, in particular UV LEDs and UV photodetectors. The nanowires or nanopyramids can be provided with a conductive and ideally reflective top contact electrode material to enable a flip chip arrangement.

BACKGROUND

Over recent years, interest in semiconductor nanocrystals (such as nanowires and nanopyramids) has intensified as nanotechnology becomes an important engineering discipline. Nanowires, which are also referred to as nanowhiskers, nanorods, nanopillars, nanocolumns, etc. by some authors, have found important applications in a variety of electrical devices such as sensors, solar cells, and light emitting diodes (LEDs).

The present invention concerns LEDs and photodetectors which in particular emit and detect light in the ultra violet (UV) spectrum, respectively. The UV light can be classified into three separate wavelength types: UV-A: 315 to 400 nm, UV-B: 280 to 315, and UV-C: 100 to 280 nm.

Applications of UV-C light (especially Deep-UV (250-280 nm) include water and air purification, and surface disinfection by destroying bacteria, viruses, protozoa and other microbes by directly attacking their DNA. Deep-UV disinfection also provides many benefits over chemical options. It cannot be overdosed, and does not produce by-products, toxins, or volatile organic compounds. Deep-UV light is well suited to treat microorganisms which become extremely resistant to chemical disinfectants, as they are unable to develop immunity to Deep-UV radiation.

In the health sector, Deep-UV light might help sterilize medical tools or destroy deadly virus such as H1N1, and Ebola. In food processing, UV light can help enhance shelf life of food products. UV light emitters might find application in consumer electronic products such as water purifiers, air cleaner, toothbrush sterilizer, and other sanitary products.

Current UV emitters are often based on Mercury lamps which are expensive, energy inefficient, bulky, fragile and difficult to dispose of. It would be very interesting to develop a reliable and economic LED which emits in the UV area, especially in the UV-C area, which is also the most difficult to achieve.

The small size and low power consumption, longer operating lifetime, less maintenance, environmental friendliness and easy disposal makes UV LEDs a much more attractive solution than the likes of a Mercury lamp.

UV LEDs are usually manufactured using group III-Nitride semiconductor thin films, especially using Al rich nitride materials. The higher the Al content incorporated in the structure, the deeper wavelength of the light can be achieved. Several research groups have demonstrated the fabrication of thin film based LEDs using AlGaN, AlInGaN and AlN. However, the maximum external quantum efficiencies (EQE) achieved so far are between 2 and 6%, and about 1% for UV-B, and UV-C LEDs, respectively [Kneissl, Semiconductor Sci and Tech. 26 (2011) 014036].

There are numerous problems in preparing a UV LED, in particular ones based on AlGaN, AlInGaN and AlN thin films, leading to very low EQEs. It is difficult to grow high quality AlGaN thin film on conventional supports such as sapphire or silicon on which nanowire growth might occur. AlN substrates that lattice match very closely with AlGaN are expensive to prepare and there is a lack of large size AlN wafers. To our knowledge, the largest available wafer is 1.5" wafer with transparency about 60% at 265 nm.

In order to function as a UV emitter, it may also be necessary to employ an electrode material that is transparent to the UV light. A common electrode material, indium tin oxide (ITO) is not transparent in the Deep UV region. There are other problems such as a large internal reflection at the sapphire substrate/air interface, leading to large absorption of the reflected Deep UV light inside the LED. Sapphire is therefore not ideal as a substrate for a UV LED. The present invention therefore relates to UV LEDs based on nanowires or nanopyramids as opposed to films of semiconducting material.

UV nanowire (NW) LEDs have, however, been suggested in the article Zhao, Scientific Reports 5, (2015) 8332, which discusses nitrogen polar AlGaN NWs grown on Si which are deep UV emitters. Note that the process for nanowire growth requires the growth of a GaN NW stem on the Si support. Despite of the improvement in the internal quantum efficiency (IQE) of these NW based LEDs compared to the thin film based LEDs, the EQE has still remained low due to the absorption of the emitted light by the silicon substrate and the top contact. In addition, the nanowires grown in this study are randomly positioned leading to inhomogeneity in the composition and size of NWs, reducing the performance of the device.

The present inventors ideally seek UV LEDs preferably based on AlGaN, AN or AlInGaN nanowires or nanopyramids. AlGaN or AlInGaN nanowires or nanopyramids based materials are the most suitable materials for the realization of LEDs covering the entire UV-A, UV-B, and UV-C bands.

The present inventors therefore propose a solution involving the growth of nanowires (NWs) or nanopyramids (NPs) on graphitic substrates such as graphene. In particular, the inventors consider growing AlN/AlGaN/AlInGaN NWs or NPs on graphene. Graphene acts both as a substrate as well as transparent and conductive contact to the NWs. Due to the transparency of graphene across all UV wavelengths and in particular in the UV-C wavelength region, graphene can be used as a bottom contact for NW or NP based UV LED devices. Moreover, the inventors have appreciated that a preferred device design involves a flip-chip design where the bottom graphitic contact/substrate is used as the emitting side of the LED, as that improves light extraction efficiency.

In addition, higher carrier injection efficiency is required to obtain higher external quantum efficiency (EQE) of LEDs. However, the increasing ionization energy of magnesium acceptors with increasing Al mole fraction in AlGaN alloys makes it difficult to obtain higher hole concentration in AlGaN alloys with higher Al content. To obtain higher hole injection efficiency (especially in the barrier layers consisting of high Al content), the inventors have devised a number of strategies which can be used individually or together.

The growth of nanowires on graphene is not new. In WO2012/080252, there is a discussion of the growth of semiconductor nanowires on graphene substrates using molecular beam epitaxy (MBE). WO2013/104723 concerns improvements on the '252 disclosure in which a graphene top contact is employed on NWs grown on graphene. These previous documents are not, however, concerned with UV LED flip chips. More recently, the inventors have described core shell nanowires grown on graphene (WO2013/190128).

US 2011/0254034 describes nanostructured LEDs emitting in the visible region. The device comprises a nanostructured LED with a group of nanowires protruding from a substrate. The nanowires have a p-i-n junction and a top portion of each nanowire is covered with a light-reflective contact layer which may also act as an electrode. When a voltage is applied between the electrode and the light-reflective contact layer, light is generated within the nanowire.

No one before, however, has considered an LED flip chip based on nanowires (NWs) or nanopyramids (NPs) grown on graphene.

SUMMARY OF INVENTION

Thus, viewed from one aspect, the invention provides a light emitting diode device comprising:

a plurality of nanowires or nanopyramids grown on a graphitic substrate, said nanowires or nanopyramids having a p-n or p-i-n junction, a first electrode in electrical contact with said graphitic substrate;

a second electrode in contact with the top of at least a portion of said nanowires or nanopyramids optionally in the form of a light reflective layer;

wherein said nanowires or nanopyramids comprise at least one group III-V compound semiconductor. In use, light is preferably emitted in a direction substantially parallel to but opposite from the growth direction of the nanowires.

Viewed from another aspect, the invention provides a light emitting diode device comprising:

a plurality of nanowires or nanopyramids grown on a graphitic substrate, preferably through the holes of an optional hole-patterned mask on said graphitic substrate, said nanowires or nanopyramids having a p-n or p-i-n junction, a first electrode in electrical contact with said graphitic substrate;

a light reflective layer in contact with the top of at least a portion of said nanowires or nanopyramids or in contact with a second electrode in electrical contact with the top of at least a portion of said nanowires or nanopyramids, said light reflective layer optionally acting as the second electrode;

a second electrode in electrical contact with the top of at least a portion of said nanowires or nanopyramids, said second electrode being essential where said light reflective layer does not act as an electrode;

wherein said nanowires or nanopyramids comprise at least one group III-V compound semiconductor; and wherein in use light is emitted from said device in a direction substantially opposite to said light reflective layer.

Viewed from another aspect, the invention provides a light emitting diode device comprising:

a plurality of nanowires or nanopyramids grown on a graphitic substrate, preferably through the holes of an optional hole-patterned mask on said graphitic substrate, said nanowires or nanopyramids having a p-n or p-i-n junction, a first electrode in electrical contact with said graphitic substrate;

a light reflective layer in contact with the top of at least a portion of said nanowires or nanopyramids, said light reflective layer optionally acting as the second electrode;

a second electrode in electrical contact with the top of at least a portion of said nanowires or nanopyramids, said second electrode being essential where said light reflective layer does not act as an electrode;

wherein said nanowires or nanopyramids comprise at least one group III-V compound semiconductor; and wherein in use light is emitted from said device in a direction substantially opposite to said light reflective layer.

Viewed from another aspect, the invention provides a nanostructured LED comprising a plurality of group III-V compound semiconductor nanowires or nanopyramids grown epitaxially on a graphitic substrate; wherein each of the nanowires or nanopyramids protrudes from the substrate and each nanowire or nanopyramid comprises a p-n or p-i-n-junction;

the top part of at least a portion of said nanowires or nanopyramids is covered with a light-reflective or transparent contact layer to form at least one contact to group of nanowires or nanopyramids;

an electrode is in electrical contact with said graphitic substrate;

the light-reflective or transparent contact layer is in electrical contact with the first electrode via said nanowires or nanopyramids.

Viewed from another aspect, the invention provides use of an LED device as hereinbefore defined as a LED, in particular in the UV region of the spectrum.

In a second embodiment, the invention relates to a photodetector. Rather than emitting light, the device of the invention can be adapted to absorb light and subsequently generate a photocurrent and hence detect light.

Thus, viewed from another aspect the invention provides a photodetector device comprising:

a plurality of nanowires or nanopyramids grown on a graphitic substrate, said nanowires or nanopyramids having a p-n or p-i-n junction, a first electrode in electrical contact with said graphitic substrate;

a second electrode in contact with the top of at least a portion of said nanowires or nanopyramids optionally in the form of a light reflective layer;

wherein said nanowires or nanopyramids comprise at least one group III-V compound semiconductor; and wherein in use light is absorbed in said device.

Viewed from another aspect the invention provides a nanostructured photodetector comprising a plurality of group III-V compound semiconductor nanowires or nanopyramids grown epitaxially on a graphitic substrate; wherein each of the plurality of nanowires or nanopyramids protrudes from the substrate and each nanowire or nanopyramid comprises a p-n- or p-i-n-junction;

a top portion of each nanowire or nanopyramid or at least one group of nanowires or nanopyramids from the plurality of nanowires or nanopyramids is covered with a transparent contact layer to form at least one contact to group of nanowires or nanopyramids;

an electrode is in electrical contact with said graphitic substrate;

the transparent contact layer is in electrical contact with the first electrode via the p-n or p-i-n-junction in said nanowires or nanopyramids.

Viewed from another aspect, the invention provides use of a photodetector device as hereinbefore defined as a photodetector, in particular in the UV region of the spectrum.

Definitions

By a group III-V compound semiconductor is meant one comprising at least one element from group III and at least one element from group V. There may be more than one element present from each group, e.g. AlGaN (i.e. a ternary compound), AlInGaN (i.e. a quaternary compound), and so on. The designation Al(In)GaN implies either AlGaN or AlInGaN, i.e. that the presence of In is optional. Any element indicated in brackets may or may not be present.

The term nanowire is used herein to describe a solid, wire-like structure of nanometer dimensions. Nanowires preferably have an even diameter throughout the majority of the nanowire, e.g. at least 75% of its length. The term nanowire is intended to cover the use of nanorods, nanopillars, nanocolumns or nanowhiskers some of which may have tapered end structures. The nanowires can be said to be in essentially in one-dimensional form with nanometer dimensions in their width or diameter and their length typically in the range of a few 100 nm to a few μm. Ideally the nanowire diameter is between 50 and 500 nm, however, the diameter can exceed few microns (called microwires).

Ideally, the diameter at the base of the nanowire and at the top of the nanowire should remain about the same (e.g. within 20% of each other).

The term nanopyramid refers to a solid pyramidal type structure. The term pyramidal is used herein to define a structure with a base whose sides taper to a single point generally above the centre of the base. It will be appreciated that the single vertex point may appear chamfered. The nanopyramids may have multiple faces, such as 3 to 8 faces, or 4 to 7 faces. Thus, the base of the nanopyramids might be a square, pentagonal, hexagonal, heptagonal, octagonal and so on. The pyramid is formed as the faces taper from the base to a central point (forming therefore triangular faces). The triangular faces are normally terminated with (1-101) or (1-102) planes. The triangular side surfaces with (1-101) facets could either converge to a single point at the tip or could form a new facets ((1-102) planes) before converging at the tip. In some cases, the nanopyramids are truncated with its top terminated with {0001} planes. The base itself may comprise a portion of even cross-section before tapering to form a pyramidal structure begins. The thickness of the base may therefore be up to 200 nm, such as 50 nm.

The base of the nanopyramids can be 50 and 500 nm in diameter across its widest point. The height of the nanopyramids may be 200 nm to a few microns, such as 400 nm to 1 micron in length.

It will be appreciated that the substrate carries a plurality of nanowires or nanopyramids. This may be called an array of nanowires or nanopyramids.

Graphitic layers for substrates or possibly top contacts are films composed of single or multiple layers of graphene or its derivatives. The term graphene refers to a planar sheet of $sp^2$-bonded carbon atoms in a honeycomb crystal structure. Derivatives of graphene are those with surface modification. For example, the hydrogen atoms can be attached to the graphene surface to form graphene. Graphene with oxygen atoms attached to the surface along with carbon and hydrogen atoms is called as graphene oxide. The surface modification can be also possible by chemical doping or oxygen/hydrogen or nitrogen plasma treatment.

The term epitaxy comes from the Greek roots epi, meaning "above", and taxis, meaning "in ordered manner". The atomic arrangement of the nanowire or nanopyramid is based on the crystallographic structure of the substrate. It is a term well used in this art. Epitaxial growth means herein the growth on the substrate of a nanowire or nanopyramid that mimics the orientation of the substrate.

Selective area growth (SAG) is the most promising method for growing positioned nanowires or nanopyramids. This method is different from the metal catalyst assisted vapour-liquid-solid (VLS) method, in which metal catalyst act as nucleation sites for the growth of nanowires or nanopyramids. Other catalyst-free methods to grow nanowires or nanopyramids are self-assembly, spontaneous MBE growth, and so on, where nanowires or nanopyramids are nucleated in random positions. These methods yield huge fluctuations in the length and diameter of the nanowires or nanopyramids.

The SAG method typically requires a mask with nanohole patterns on the substrate. The nanowires or nanopyramids nucleate in the holes of the patterned mask on the substrate. This yields uniform size and pre-defined position of the nanowires or nanopyramids.

The term mask refers to the mask material that is directly deposited on the graphitic layer. The mask material should ideally not absorb emitted light (which could be visible, UV-A, UV-B or UV-C) in the case of an LED or not absorb the entering light of interest in the case of a photodetector. The mask should also be electrically non-conductive. The mask could contain one or more than one material, which include $Al_2O_3$, $SiO_2$, $Si_3N_4$, $TiO_2$, $W_2O_3$, and so on. Subsequently, the hole patterns in the mask material can be prepared using electron beam lithography or nanoimprint lithography and dry or wet etching.

MBE is a method of forming depositions on crystalline substrates. The MBE process is performed by heating a crystalline substrate in a vacuum so as to energize the substrate's lattice structure. Then, an atomic or molecular mass beam(s) is directed onto the substrate's surface. The term element used above is intended to cover application of atoms, molecules or ions of that element. When the directed atoms or molecules arrive at the substrate's surface, the directed atoms or molecules encounter the substrate's energized lattice structure as described in detail below. Over time, the incoming atoms form a nanowire or nanopyramid.

Metal organic vapour phase epitaxy (MOVPE) also called as metal organic chemical vapour deposition (MOCVD) is an alternative method to MBE for forming depositions on crystalline substrates. In case of MOVPE, the deposition material is supplied in the form of metal organic precursors, which on reaching the high temperature substrate decompose leaving atoms on the substrate surface. In addition, this method requires a carrier gas (typically $H_2$ and/or $N_2$) to transport deposition materials (atoms/molecules) across the substrate surface. These atoms reacting with other atoms form an epitaxial layer on the substrate surface. Choosing the deposition parameters carefully results in the formation of a nanowire or nanopyramid.

The term SPSL refers to a short period superlattice.

It will be appreciated that nanowires or nanopyramids have a p-n or p-i-n junction. The orientation of the junction does not matter (i.e. the junction can be n-i-p or n-p or p-i-n or p-n). In most cases, it is preferred to grow n-type layer first followed by i, if used, and p-type layers.

DETAILED DESCRIPTION OF INVENTION

This invention concerns LEDs in a flip chip arrangement or a photodetector in a flip chip arrangement. Whilst the invention is primarily described with reference to an LED, the reader will appreciate that essentially the same device can be used as a photodetector. Also, whilst the invention preferably concerns the emission and detection of UV light, the device is also applicable in other regions of the electromagnetic spectrum, in particular the visible region.

A device according to the invention comprises a nanostructured LED with a plurality of nanowires or nanopyramids grown on a graphitic substrate. Each nanowire or nanopyramid protrudes from a substrate and these substantially comprise a p-n or p-i-n junction. For completeness, it may be that a few nanowires or nanopyramids are free of a p-n or p-i-n junction for some reason. The invention relates to devices in which the intention is that all the nanowires or nanopyramids contain the necessary junction but encompasses devices in which a few nanowires or nanopyramids might be free of such a junction. Ideally all nanowires or nanopyramids contain the necessary junction.

A top portion of each nanowire or nanopyramid may be provided with a light-reflective layer. This may simply touch the top of the nanowires or nanopyramids or encompass a top part of the nanowires or nanopyramids. The light-reflective layer may also act as a top contact electrode for the device or alternatively a separate top electrode may be provided. If an electrode is provided, a light reflective layer may be in electrical contact with this electrode which is in electrical contact with the top of at least a portion of said nanowires or nanopyramids. It is thus important that there is an electrode that is in good electrical contact with both the top of the nanowires or nanopyramids top and the external circuit.

An electrode is also provided in electrical contact with the bottom portion of each nanowire or nanopyramid through the conductive graphitic substrate. Hence there is a circuit via the top electrode which is in electrical contact with the other electrode via the p-n or p-i-n-junction in the nanowires or nanopyramids.

When a forward voltage is applied between the electrodes, light, preferably UV light is generated in the active region in the nanowire or nanopyramid, the device works as a LED.

When a reverse voltage is applied between the electrodes and is exposed to light, preferably UV light, the active region in the nanowire or nanopyramid absorbs the light and converts it into photocurrent, the device works as a photodetector.

Having a nanowire or nanopyramid grown epitaxially provides homogeneity to the formed material which may enhance various end properties, e.g. mechanical, optical or electrical properties.

Epitaxial nanowires or nanopyramids may be grown from solid, gaseous or liquid precursors. Because the substrate acts as a seed crystal, the deposited nanowire or nanopyramid can take on a lattice structure and/or orientation similar to those of the substrate. This is different from some other thin-film deposition methods which deposit polycrystalline or amorphous films, even on single-crystal substrates.

Substrate for Nanowire or Nanopyramid Growth

The substrate used to grow nanowires or nanopyramids is a graphitic substrate, more especially it is graphene. As used herein, the term graphene refers to a planar sheet of $sp^2$-bonded carbon atoms that are densely packed in a honeycomb (hexagonal) crystal lattice. This graphitic substrate should preferably be no more than 20 nm in thickness. Ideally, it should contain no more than 10 layers of graphene or its derivatives, preferably no more than 5 layers (which is called as a few-layered graphene). Especially preferably, it is a one-atom-thick planar sheet of graphene.

The crystalline or "flake" form of graphite consists of many graphene sheets stacked together (i.e. more than 10 sheets). By graphitic substrate therefore, is meant one formed from one or a plurality of graphene sheets.

It is preferred if the substrate in general is 20 nm in thickness or less. Graphene sheets stack to form graphite with an interplanar spacing of 0.335 nm. The graphitic substrate preferred comprises only a few such layers and may ideally be less than 10 nm in thickness. Even more preferably, the graphitic substrate may be 5 nm or less in thickness. The area of the substrate in general is not limited. This might be as much as 0.5 mm$^2$ or more, e.g. up to 5 mm$^2$ or more such as up to 10 cm$^2$. The area of the substrate is thus only limited by practicalities.

In a preferred embodiment, the substrate is a laminated substrate exfoliated from a Kish graphite, a single crystal of graphite or is a highly ordered pyrolytic graphite (HOPG). Graphene could also be grown on SiC by a sublimation method, or grown by a self-assembly method on substrates such as Si or Ge. Graphene can even be grown by MBE directly on such substrates.

Alternatively, the substrate could be grown on a Ni film or Cu foil by using a chemical vapour deposition (CVD) method. The substrate could be a CVD-grown graphene substrate on metallic films or foils made of e.g. Cu, Ni, or Pt.

These CVD-grown graphitic layers can be chemically exfoliated from the metal foil such as a Ni or Cu film by etching or by an electrochemical delamination method. The graphitic layers after exfoliation are then transferred and deposited to the supporting carrier for nanowire or nanopyramid growth. During the exfoliation and transfer, e-beam resist or photoresist may be used to support the thin graphene layers. These supporting materials can be easily removed by acetone after deposition.

Whilst it is preferred if the graphitic substrate is used without modification, the surface of the graphitic substrate can be modified. For example, it can be treated with plasma of hydrogen, oxygen, nitrogen, NO$_2$ or their combinations. Oxidation of the substrate might enhance nanowire or nanopyramid nucleation. It may also be preferable to pretreat the substrate, for example, to ensure purity before nanowire or nanopyramid growth. Treatment with a strong acid such as HF or BOE is an option. Substrates might be washed with iso-propanol, acetone, or n-methyl-2-pyrrolidone to eliminate surface impurities.

The cleaned graphitic surface can be further modified by doping. Dopant atoms or molecules may act as a seed for growing nanowires or nanopyramids. A solution of FeCl$_3$, AuCl$_3$ or GaCl$_3$ could be used in a doping step.

The graphitic layers, more preferably graphene, are well known for their superior optical, electrical, thermal and mechanical properties. They are very thin but very strong, light, flexible, and impermeable. Most importantly in the present invention they are highly electrically and thermally conducting, and transparent. Compared to other transparent conductors such as ITO, ZnO/Ag/ZnO, Al doped ZnO and TiO$_2$/Ag/TiO$_2$ which are commercially used now, graphene has been proven to be much more transparent (~98% transmittance in the UV spectral range of interest from 200 to 400 nm in wavelength) and conducting (<1000 Ohm□$^{-1}$ sheet resistance for 1 nm thickness).

Support for Substrate

The graphitic substrate may need to be supported in order to allow growth of the nanowires or nanopyramids thereon. The substrate can be supported on any kind of material including conventional semiconductor substrates and transparent glasses. It is preferred if the support is transparent so that the substrate does not block light from exiting or entering the device.

Examples of preferred substrates include fused silica, fused quartz, fused alumina, silicon carbide or AlN. The use of fused silica or quartz is preferred, especially fused silica. The support should be inert.

The thickness of the support is not important as long as it acts to support the substrate and is transparent. The term transparent is used here to mean that the support allows transmission of light, in particular UV light. In particular, it is preferred if the support is transparent to UV-B and UV-C light.

In theory, once the nanowires or nanopyramids are grown, the support might be removed (e.g. by etching) or the nanowires or nanopyramids can be peeled away from the support. If the support is removed or potentially replaced by another support structure, that might allow the use of supports that are not transparent during the nanowire or nanopyramid growth process. The use therefore of a LED in the absence of a support is within the scope of the invention. It is however preferred if a support is present in the LED device.

Intermediate Layer

The graphitic substrate is provided in a sheet and can potentially have a higher than desired sheet resistance. Sheet resistance is a measure of lateral resistance of a thin film that is nominally uniform in thickness. In order to reduce sheet resistance, it is preferred if an intermediate layer is provided between the graphitic substrate and the support. That intermediate layer is preferably hexagonal boron nitride (hBN) or could be a silver nanowire network or a metallic grid. The intermediate layer may be present before nanowire or nanopyramid growth.

In an alternative embodiment, the intermediate layer can be applied after the support has been removed. Hence NWs can be grown on the graphene layer carried on a support, the support then removed and the intermediate layer then applied on the back side of the graphene substrate (i.e. opposite the grown nanowires or nanopyramids).

The presence of this intermediate layer reduces the sheet resistance of the graphitic substrate and therefore enhances the performance of the device. In fact, the use of silver nanowires as an intermediate layer has been found to reduce the sheet resistance of the graphene to as low as 16 ohms□⁻¹.

A further option for reducing sheet resistance is to employ two or more separate graphitic layers. Whilst therefore the nanowires or nanopyramids are grown on surface of a graphitic substrate, the device can be provided with further graphitic layers on the opposite side to the nanowire or nanopyramid carrying surface.

Again, it will be important that the intermediate layer is transparent to light, in particular UV light and especially UV-B and UV-C.

The thickness of the intermediate layer is not critical but as it acts to reduce sheet resistance, it is ideally as thin as possible, in order to carry out its desired function and in the case of hBN, may be a couple of monolayers. It may therefore be around the same thickness as the substrate layer. Suitable thicknesses are therefore 10 to 200 nm, such as 20 to 100 nm.

Growth of Nanowires or Nanopyramids

In order to prepare nanowires or nanopyramids of commercial importance, it is preferred that these grow epitaxially on the substrate. It is also ideal if growth occurs perpendicular to the substrate and ideally therefore in the [0001] (for hexagonal crystal structure) direction.

The present inventors have determined that epitaxial growth on graphitic substrates is possible by determining a possible lattice match between the atoms in the semiconductor nanowire or nanopyramid and the carbon atoms in the graphene sheet.

The carbon-carbon bond length in graphene layers is about 0.142 nm. Graphite has hexagonal crystal geometry. The present inventors have previously realised that graphite can provide a substrate on which semiconductor nanowires or nanopyramids can be grown as the lattice mismatch between the growing nanowire or nanopyramid material and the graphitic substrate can be very low.

The inventors have realised that due to the hexagonal symmetry of the graphitic substrate and the hexagonal symmetry of the semiconductor atoms in the (0001) planes of a nanowire or nanopyramid growing in the [0001] direction with a hexagonal crystal structure), a lattice match can be achieved between the growing nanowires or nanopyramids and the substrate. A comprehensive explanation of the science here can be found in WO2013/104723.

Without wishing to be limited by theory, due to the hexagonal symmetry of the carbon atoms in graphitic layers, and the hexagonal symmetry of the atoms in the (111) planes of a nanowire or nanopyramid growing in [111] direction with a cubic crystal structure (or in the (0001) planes of a nanowire or nanopyramid growing in the [0001] crystal direction with a hexagonal crystal structure), a close lattice match between the graphitic substrate and semiconductor can be achieved when the semiconductor atoms are placed above the carbon atoms of the graphitic substrate, ideally in a hexagonal pattern. This is a new and surprising finding and can enable the epitaxial growth of nanowires or nanopyramids on graphitic substrates.

The different hexagonal arrangements of the semiconductor atoms as described in WO2013/104723, can enable semiconductor nanowires or nanopyramids of such materials to be vertically grown to form free-standing nanowires or nanopyramids on top of a thin carbon-based graphitic material.

In a growing nanopyramid, the triangular faces are normally terminated with (1-101) or (1-102) planes. The triangular side surfaces with (1-101) facets couldeither converge to a single point at the tip or could form a new facets ((1-102) planes) before converging at the tip. In some cases, the nanopyramids are truncated with its top terminated with {0001} planes.

Whilst it is ideal that there is no lattice mismatch between a growing nanowire or nanopyramid and the substrate, nanowires or nanopyramids can accommodate much more lattice mismatch than thin films for example. The nanowires or nanopyramids of the invention may have a lattice mismatch of up to about 10% with the substrate and epitaxial growth is still possible. Ideally, lattice mismatches should be 7.5% or less, e.g. 5% or less.

For some semiconductors like hexagonal GaN (a=3.189 Å), hexagonal AlN (a=3.111 Å), the lattice mismatch is so small (<~5%) that excellent growth of these semiconductor nanowires or nanopyramids can be expected.

Growth of nanowires/nanopyramids can be controlled through flux ratios. Nanopyramids are encouraged, for example if high group V flux is employed.

The nanowires grown in the present invention may be from 250 nm to several microns in length, e.g. up to 5 microns. Preferably the nanowires are at least 1 micron in length. Where a plurality of nanowires are grown, it is preferred if they all meet these dimension requirements. Ideally, at least 90% of the nanowires grown on a substrate will be at least 1 micron in length. Preferably substantially all the nanowires will be at least 1 micron in length.

Nanopyramids may be 250 nm to 1 micron in height, such as 400 to 800 nm in height, such as about 500 nm.

Moreover, it will be preferred if the nanowires or nanopyramids grown have the same dimensions, e.g. to within 10% of each other. Thus, at least 90% (preferably substantially all) of the nanowires or nanopyramids on a substrate will preferably be of the same diameter and/or the same length (i.e. to within 10% of the diameter/length of each other). Essentially, therefore the skilled man is looking for homogeneity and nanowires or nanopyramids that are substantially the same in terms of dimensions.

The length of the nanowires or nanopyramids is often controlled by the length of time for which the growing process runs. A longer process typically leads to a (much) longer nanowire or nanopyramid.

The nanowires have typically a hexagonal cross sectional shape. The nanowire may have a cross sectional diameter of 25 nm to several hundred nm (i.e. its thickness). As noted above, the diameter is ideally constant throughout the majority of the nanowire. Nanowire diameter can be controlled by the manipulation of the ratio of the atoms used to make the nanowire as described further below.

Moreover, the length and diameter of the nanowires or nanopyramids can be affected by the temperature at which they are formed. Higher temperatures encourage high aspect ratios (i.e. longer and/or thinner nanowires or nanopyramids). The diameter can also be controlled by manipulating the nanohole opening size of the mask layer. The skilled man is able to manipulate the growing process to design nanowires or nanopyramids of desired dimensions.

The nanowires or nanopyramids of the invention are formed from at least one III-V compound semi-conductor. Preferably, the nanowires or nanopyramids consists of group III-V compounds only optionally doped as discussed below. Note that there may be more than one different group III-V compound present but it is preferred if all compounds present are group III-V compounds.

Group III element options are B, Al, Ga, In, and Tl. Preferred options here are Ga, Al and In.

Group V options are N, P, As, Sb. All are preferred, especially N.

It is of course possible to use more than one element from group III and/or more than one element from group V. Preferred compounds for nanowire or nanopyramid manufacture include AlAs, GaSb, GaP, GaN, AlN, AlGaN, AlGaInN, GaAs, InP, InN, InGaAs, InSb, InAs, or AlGaAs. Compounds based on Al, Ga and In in combination with N are most preferred. The use of GaN, AlGaN, AlInGaN or AlN is highly preferred.

It is most preferred if the nanowires or nanopyramids consist of Ga, Al, In and N (along with any doping atoms as discussed below).

Whilst the use of binary materials is possible, the use of ternary nanowires or nanopyramids in which there are two group III cations with a group V anion are preferred here, such as AlGaN. The ternary compounds may therefore be of formula XYZ wherein X is a group III element, Y is a group III different from X, and Z is a group V element. The X to Y molar ratio in XYZ is preferably 0.1 to 0.9, i.e. the formula is preferably $X_xY_{1-x}Z$ where subscript x is 0.1 to 0.9.

Quaternary systems might also be used and may be represented by the formula $A_xB_{1-x}C_yD_{1-y}$ where A, B and C are different group III elements and D is a group V element. Again subscripts x and y are typically 0.1 to 0.9. Other options will be clear to the skilled man.

The growth of AlGaN and AlInGaN nanowires or nanopyramids is especially preferred. The wavelength of light emitted by a device containing these nanowires or nanopyramids can be tailored by manipulating the content of Al, In and Ga. Alternatively, the pitch and/or diameter of the nanowires or nanopyramids can be varied to change the nature of the light emitted.

It is further preferred if the nanowires or nanopyramids contain regions of differing compounds. The nanowire or nanopyramid might therefore contain a region of a first group III-V semiconductor such as GaN followed by a region of a different III-V semi-conductor such as AlGaN. Nanowires or nanopyramids can contain multiple regions such as two or more or three or more. These regions might be layers in an axially grown nanowire or shells in a radially grown nanowire or nanopyramid.

Doping

The nanowires or nanopyramids of the invention need to contain a p-n or p-i-n junction. Devices of the invention, especially those based on a p-i-n junction are therefore optionally provided with an undoped intrinsic semiconductor region between a p-type semiconductor and an n-type semiconductor region. The p-type and n-type regions are typically heavily doped because they are used for ohmic contacts.

It is therefore preferred that the nanowires or nanopyramids are doped. Doping typically involves the introduction of impurity ions into the nanowire or nanopyramid, e.g. during MBE or MOVPE growth. The doping level can be controlled from $\sim 10^{15}/cm^3$ to $10^{20}/cm^3$. The nanowires or nanopyramids can be p-type doped or n-type doped as desired. Doped semiconductors are extrinsic conductors.

The n(p)-type semiconductors have a larger electron (hole) concentration than hole (electron) concentration by doping an intrinsic semiconductor with donor (acceptor) impurities. Suitable donor (acceptors) for III-V compounds, especially nitrides, can be Si (Mg, Be and Zn). Dopants can be introduced during the growth process or by ion implantation of the nanowires or nanopyramids after their formation.

As previously noted, higher carrier injection efficiency is required to obtain higher external quantum efficiency (EQE) of LEDs. However, the increasing ionization energy of Mg acceptors with increasing Al content in AlGaN alloys makes it difficult to obtain higher hole concentration in AlGaN alloys with higher Al content. To obtain higher hole injection efficiency (especially in the barrier layers consisting of high Al content), the inventors have devised a number of strategies which can be used individually or together.

There are problems to overcome in the doping process therefore. It is preferred if the nanowires or nanopyramids of the invention comprise Al. The use of Al is advantageous as high Al content leads to high band gaps, enabling UV-C LED emission from the active layer(s) of nanowires or nanopyramids and/or avoiding absorption of the emitted light in the doped barrier layers. Where the band gap is high, it is less likely that UV light is absorbed by this part of the nanowires or nanopyramids. The use therefore of AlN or AlGaN in nanowires or nanopyramids is preferred.

However, p-type doping of AlGaN or AlN to achieve high electrical conductivity (high hole concentration) is challenging as the ionization energy of Mg or Be acceptors increases with increasing Al content in AlGaN alloys. The present inventors propose various solutions to maximise electrical conductivity (i.e. maximise hole concentration) in AlGaN alloys with higher average Al content.

Where the nanowires or nanopyramids comprise AlN or AlGaN, achieving high electrical conductivity by introducing p-type dopants is a challenge. One solution relies on a short period superlattice (SPSL). In this method, we grow a superlattice structure consisting of alternating layers with different Al content instead of a homogeneous AlGaN layer with higher Al composition. For example, the barrier layer with 35% Al content could be replaced with a 1.8 to 2.0 nm thick SPSL consisting of, for example, alternating $Al_xGa_{1-x}N$:Mg/$Al_yGa_{1-y}N$:Mg with x=0.30/y=0.40. The low ionization energy of acceptors in layers with lower Al composition leads to improved hole injection efficiency without compromising on the barrier height in the barrier layer. This effect is additionally enhanced by the polarization fields at the interfaces. The SPSL can be followed with a highly p-doped GaN:Mg layer for better hole injection.

More generally, the inventors propose to introduce a p-type doped $Al_xGa_{1-x}N/Al_yGa_{1-y}N$ short period superlattice (i.e. alternating thin layers of $Al_xGa_{1-x}N$ and $Al_yGa_{1-y}N$) into the nanowires or nanopyramid structure, where the Al mole fraction x is less than y, instead of a p-type doped $Al_zGa_{1-z}N$ alloy where x<z<y. It is appreciated that x could be as low as 0 (i.e. GaN) and y could be as high as 1 (i.e. AlN). The superlattice period should preferably be 5 nm or less, such as 2 nm, in which case the superlattice will act as a single $Al_zGa_{1-z}N$ alloy (with z being a layer thickness weighted average of x and y) but with a higher electrical conductivity than that of the $Al_zGa_{1-z}N$ alloy, due to the higher p-type doping efficiency for the lower Al content $Al_xGa_{1-x}N$ layers.

In the nanowires or nanopyramids comprising a p-type doped superlattice, it is preferred if the p-type dopant is an alkali earth metal such as Mg or Be.

A further option to solve the problem of doping an Al containing nanowire/nanopyramid follows similar principles. Instead of a superlattice containing thin AlGaN layers with low or no Al content, a nanostructure can be designed containing a gradient of Al content (mole fraction) in the growth direction of the AlGaN within the nanowires or nanopyramids. Thus, as the nanowires or nanopyramids grow, the Al content is reduced/increased and then increased/reduced again to create an Al content gradient within the nanowires or nanopyramids.

This may be called polarization doping. In one method, the layers are graded either from GaN to AlN or AlN to GaN. The graded region from GaN to AlN and AlN to GaN may lead to n-type and p-type conduction, respectively. This can happen due to the presence of dipoles with different magnitude compared to its neighbouring dipoles. The GaN to AlN and AlN to GaN graded regions can be additionally doped with n-type dopant and p-type dopant respectively.

In a preferred embodiment, p-type doping is used in AlGaN nanowires using Be as a dopant.

Thus, one option would be to start with a GaN nanowire/nanopyramid and increase Al and decrease Ga content gradually to form AlN, perhaps over a growth thickness of 100 nm. This graded region could act as a p- or n-type region, depending on the crystal plane, polarity and whether the Al content is decreasing or increasing in the graded region, respectively. Then the opposite process is effected to produce GaN once more to create an n- or p-type region (opposite to that previously prepared). These graded regions could be additionally doped with n-type dopants such as Si and p-type dopants such as Mg or Be to obtain n- or p-type regions with high charge carrier density, respectively. The crystal planes and polarity is governed by the type of nanowire/nanopyramid as is known in the art.

Viewed from another aspect therefore, the nanowires or nanopyramids of the invention comprise Al, Ga and N atoms wherein during the growth of the nanowires or nanopyramids the concentration of Al is varied to create an Al concentration gradient within the nanowires or nanopyramids.

In a third embodiment, the problem of doping in an Al containing nanowire or nanopyramid is addressed using a tunnel junction. A tunnel junction is a barrier, such as a thin layer, between two electrically conducting materials. In the context of the present invention, the barrier functions as an ohmic electrical contact in the middle of a semiconductor device.

In one method, a thin electron blocking layer is inserted immediately after the active region, which is followed by a p-type doped AlGaN barrier layer with Al content higher than the Al content used in the active layers. The p-type doped barrier layer is followed by a highly p-type doped barrier layer and a very thin tunnel junction layer followed by an n-type doped AlGaN layer. The tunnel junction layer is chosen such that the electrons tunnel from the valence band in p-AlGaN to the conduction band in the n-AlGaN, creating holes that are injected into the p-AlGaN layer.

More generally, it is preferred if the nanowire or nanopyramid comprises two regions of doped GaN (one p- and one n-doped region) separated by an Al layer, such as a very thin Al layer. The Al layer might be a few nm thick such as 1 to 10 nm in thickness. It is appreciated that there are other optional materials that can serve as a tunnel junction which includes highly doped InGaN layers.

It is particularly surprising that doped GaN layers can be grown on the Al layer.

In one embodiment therefore, the invention provides a nanowire or nanopyramid having a p-type doped (Al)GaN region and an n-type doped (Al)GaN region separated by an Al layer.

The nanowires or nanopyramids of the invention can be grown to have a heterostructured form radially or axially. For example for an axial heterostructured nanowire or nanopyramid, p-n junction can be axially formed by growing a p-type doped core first, and then continue with an n-doped core (or vice versa). An intrinsic region can be positioned between doped cores for a p-i-n nanowire or nanopyramid. For a radially heterostructured nanowire or nanopyramid, p-n junction can be radially formed by growing the p-doped nanowire or nanopyramid core first, and then the n-doped semiconducting shell is grown (or vice versa). An intrinsic shell can be positioned between doped regions for a p-i-n nanowire or nanopyramid.

It is preferred if the nanowires are grown axially and are therefore formed from a first section and a second section axially up the nanowire or nanopyramid. The two sections are doped differently to generate a p-n junction or p-i-n junction. The top or bottom section of the nanowire is the p-doped or n-doped section.

In a p-i-n nanowire or nanopyramid, when charge carriers are injected into the respective p- and n-regions, they recombine in the i-region, and this recombination generates light. In a p-n junction case, recombination will occur in the space charge region (as there is no intrinsic region). The light is generated inside each nanowire or nanopyramid randomly and emitted in all directions. One problem with such a structure is that a substantial fraction of the generated light is wasted, as only a portion is directed in a desired direction. The use therefore of a reflective layer ensures that the emitted light is directed out from the device in a desired direction, in particular opposite to the reflective layer. In particular, light is reflected out through the substrate and support layers (these being opposite to the light reflective layer).

In the photodetector embodiment, the reflective layer is not essential but if present, may reflect back light on to the nanowires or nanopyramids for detection that would otherwise be lost.

The nanowires or nanopyramids of the invention preferably grow epitaxially. They attach to the underlying substrate through covalent, ionic or quasi van der Waals binding. Accordingly, at the junction of the substrate and the base of the nanowire or nanopyramid, crystal planes are formed epitaxially within the nanowire or nanopyramid. These build up, one upon another, in the same crystallographic direction thus allowing the epitaxial growth of the nanowire or nanopyramid. Preferably the nanowires or nanopyramids grow vertically. The term vertically here is used to imply that the nanowires or nanopyramids grow perpendicular to the substrate. It will be appreciated that in experimental science the growth angle may not be exactly 90° but the term vertically implies that the nanowires or nanopyramids are within about 10° of vertical/perpendicular, e.g. within 5°. Because of the epitaxial growth via covalent, ionic or quasi van der Waals bonding, it is expected that there will be an intimate contact between the nanowires or nanopyramids and the graphitic substrate. To enhance the contact property further, the graphitic substrate can be doped to match the major carriers of grown nanowires or nanopyramids.

Because nanowires or nanopyramids are epitaxially grown involving physical and chemical bonding to substrates at high temperature, the bottom contact is preferably ohmic.

It will be appreciated that the substrate comprises a plurality of nanowires or nanopyramids. Preferably the nanowires or nanopyramids grow about parallel to each other. It is preferred therefore if at least 90%, e.g. at least 95%, preferably substantially all nanowires or nanopyramids grow in the same direction from the same plane of the substrate.

It will be appreciated that there are many planes within a substrate from which epitaxial growth could occur. It is preferred if substantially all nanowires or nanopyramids grow from the same plane. It is preferred if that plane is parallel to the substrate surface. Ideally the grown nanowires or nanopyramids are substantially parallel. Preferably, the nanowires or nanopyramids grow substantially perpendicular to the substrate.

The nanowires or nanopyramids of the invention should preferably grow in the [0001] direction for nanowires or nanopyramids with hexagonal crystal structure. If the nanowire has a hexagonal crystal structure, then the (0001) interface between the nanowire and the graphitic substrate represents the plane from which axial growth takes place. The nanowires or nanopyramids are preferably grown by MBE or MOVPE. In the MBE method, the substrate is provided with a molecular beam of each reactant, e.g. a group III element and a group V element preferably supplied simultaneously. A higher degree of control of the nucleation and growth of the nanowires or nanopyramids on the graphitic substrate might be achieved with the MBE technique by using migration-enhanced epitaxy (MEE) or atomic-layer MBE (ALMBE) where e.g. the group III and V elements can be supplied alternatively.

A preferred technique in case of nitrides is plasma assisted solid-source MBE, in which very pure elements such as gallium, aluminium, and indium are heated in separate effusion cells, until they begin to slowly evaporate. The rf-plasma nitrogen source is typically used to produce low energy beams of nitrogen atoms. The gaseous elements then condense on the substrate, where they may react with each other. In the example of gallium and nitrogen, single-crystal GaN is formed. The use of the term "beam" implies that evaporated atoms (e.g. gallium) and nitrogen atoms from the plasma source do not interact with each other or vacuum chamber gases until they reach the substrate.

MBE takes place in ultra high vacuum, with a background pressure of typically around $10^{-10}$ to $10^{-9}$ Torr. Nanostructures are typically grown slowly, such as at a speed of up to a few μm per hour. This allows nanowires or nanopyramids to grow epitaxially and maximises structural performance.

The nature of the light emitted is a function of the diameter and composition of the nanowire or nanopyramid. In order to tune the band gap of the nanowire or nanopyramid temperature and fluxes can be used. (Nanotechnology 25 (2014) 455201).

In the MOVPE method, the substrate is kept in a reactor in which the substrate is provided with a carrier gas and a metal organic gas of each reactant, e.g. a metal organic precursor containing a group III element and a metal organic precursor containing a group V element. The typical carrier gases are hydrogen, nitrogen, or a mixture of the two. A higher degree of control of the nucleation and growth of the nanowires or nanopyramids on the graphitic substrate might be achieved with the MOVPE technique by using pulsed layer growth technique, where e.g. the group III and V elements can be supplied alternatively.

Selective Area Growth of Nanowires or Nanopyramids

The nanowires or nanopyramids of the invention are preferably grown by selective area growth (SAG) method. This method may require a mask with nano-hole patterns deposited on the graphitic layers.

In order to prepare a more regular array of nanowires or nanopyramids with better homogeneity in height and diameter of grown nanowires or nanopyramids, the inventors envisage the use of a mask on the substrate. This mask can be provided with regular holes, where nanowires or nanopyramids can grow homogeneously in size in a regular array across the substrate. The hole patterns in the mask can be easily fabricated using conventional photo/e-beam lithography or nanoimprinting. Focused ion beam technology may also be used in order to create a regular array of nucleation sites on the graphitic surface for the nanowire or nanopyramid growth.

Thus a mask can be applied to the substrate and etched with holes exposing the substrate surface, optionally in a regular pattern. Moreover, the size and the pitch of the holes can be carefully controlled. By arranging the holes regularly, a regular pattern of nanowires or nanopyramids can be grown.

Moreover, the size of the holes can be controlled to ensure that only one nanowire or nanopyramid can grow in each hole. Finally, the holes can be made of a size where the hole is sufficiently large to allow nanowire or nanopyramid growth. In this way, a regular array of nanowires or nanopyramids can be grown.

By varying the size of the holes, one could control the size of the nanowire or nanopyramid. By varying the pitch of the holes, one could optimize the light extraction of light from the nanowires or nanopyramids.

The mask material can be any material which does not damage the underlying substrate when deposited. The mask should also be transparent to the emitted light (LED) and entering light (photodetector). The minimum hole size might be 50 nm, preferably at least 100-200 nm. The thickness of the mask can be 10 to 100 nm, such as 10 to 40 nm.

The mask itself can be made of an inert compound, such as silicon dioxide or silicon nitride. In particular, the hole-patterned mask comprises at least one insulating material such as $SiO_2$, $Si_3N_4$, $HfO_2$, $TiO_2$ or $Al_2O_3$ e.g. deposited by e-beam evaporation, CVD, PE-CVD, sputtering, or ALD. The mask can therefore be provided on the substrate surface by any convenient technique such as by electron beam deposition, CVD, plasma enhanced-CVD, sputtering, and atomic layer deposition (ALD).

The use of a Ti mask that is either nitridated/oxidized before the nanowire growth, is particularly preferred as such a mask has been found to allow growth of uniform NWs (e.g. see J. Crystal Growth 311(2009) 2063-68).

The selective area growth method yields nanowires or nanopyramids of uniform length, and diameter at predefined positions. The nanowires or nanopyramids can also be grown without mask with nano-hole patterns. In such case, the nanowires or nanopyramids will have non-uniform sizes (length and diameter), and located at random positions. These methods are different from catalyst-assisted growth methods used for the growth of other type of III-V nanowires or nanopyramids such as GaAs.

In one embodiment, it is preferred if no mask is used to grow the nanowires or nanopyramids of the invention. Moreover, the present inventors have found that nanowire density can be maximised in the absence of a mask. Nanowire densities of at least 20 nanowires per square micrometer are possible, such as at least 25 nanowires per square micrometer. These very high nanowire densities are particularly associated with GaN or AlGaN nanowires.

For the nanowire or nanopyramid growth, the graphitic substrate temperature can then be set to a temperature suitable for the growth of the nanowire or nanopyramid in question. The growth temperature may be in the range 300 to 1000° C. The temperature employed is, however, specific to the nature of the material in the nanowire or nanopyramid and the growth method. For GaN grown by MBE, a preferred temperature is 700 to 950° C., e.g. 750 to 900° C., such as 760° C. For AlGaN the range is slightly higher, for example 780 to 980° C., such as 830 to 950° C., e.g. 840° C.

It will be appreciated therefore that the nanowires or nanopyramids can comprise different group III-V semiconductors within the nanowire or nanopyramid, e.g. starting with a GaN stem followed by an AlGaN component or AlGaInN component and so on.

Nanowire or nanopyramid growth in MBE can be initiated by opening the shutter of the Ga effusion cell, the nitrogen plasma cell, and the dopant cell simultaneously initiating the growth of doped GaN nanowires or nanopyramids, hereby called as stem. The length of the GaN stem can be kept between 10 nm to several 100s of nanometers. Subsequently, one could increase the substrate temperature if needed, and open the Al shutter to initiate the growth of AlGaN nanowires or nanopyramids. One could initiate the growth of AlGaN nanowires or nanopyramids on graphitic layers without the growth of GaN stem. n- and p-type doped nanowires or nanopyramids can be obtained by opening the shutter of the n-type dopant cell and p-type dopant cell, respectively, during the nanowire or nanopyramid growth. For example, Si dopant cell for n-type doping of nanowires or nanopyramids, and Mg dopant cell for p-type doping of nanowires or nanopyramids.

The temperature of the effusion cells can be used to control growth rate. Convenient growth rates, as measured during conventional planar (layer by layer) growth, are 0.05 to 2 µm per hour, e.g. 0.1 µm per hour. The ratio of Al/Ga can be varied by changing the temperature of the effusion cells.

The pressure of the molecular beams can also be adjusted depending on the nature of the nanowire or nanopyramid being grown. Suitable levels for beam equivalent pressures are between $1\times10^{-7}$ and $1\times10^{-4}$ Torr.

The beam flux ratio between reactants (e.g. group III atoms and group V molecules) can be varied, the preferred flux ratio being dependent on other growth parameters and on the nature of the nanowire or nanopyramid being grown. In the case of nitrides, nanowires or nanopyramids are always grown under nitrogen rich conditions.

The nanowires or nanopyramids of the invention preferably comprise n-p or n-i-p Al(In)GaN or AlGaN nanowires or nanopyramids. The active layer (i-region) could consist of $Al_{x1}Ga_{y1}N/Al_{x2}Ga_{y2}N$ (x1>x2 and x1+y1=x2+y2=1) multiple quantum wells or superlattice structure. The p-region could include/comprise an electron blocking layer (single or multiple quantum barrier layers) to prevent the overflow of minority carriers (electrons) into the p-region.

It is thus a preferred embodiment if the nanowire or nanopyramid is provided with a multiple quantum well. It is thus a preferred embodiment if the nanowire or nanopyramid is provided with an electron blocking layer. Ideally, the nanowire or nanopyramid is provided with both an electron blocking layer and a multiple quantum well.

It is thus an embodiment of the invention to employ a multistep, such as two step growth procedure, e.g. to separately optimize the nanowire or nanopyramid nucleation and nanowire or nanopyramid growth.

A significant benefit of MBE is that the growing nanowire or nanopyramid can be analysed in situ, for instance by using reflection high-energy electron diffraction (RHEED). RHEED is a technique typically used to characterize the surface of crystalline materials. This technology cannot be applied so readily where nanowires or nanopyramids are formed by other techniques such as MOVPE.

A significant benefit of MOVPE is that the nanowires or nanopyramids can be grown at a much faster growth rate. This method favours the growth of radial heterostructure nanowires or nanopyramids and microwires, for example: n-type doped GaN core with shell consisting of intrinsic AlN/Al(In)GaN multiple quantum wells (MQW), AlGaN electron blocking layer (EBL), and p-type doped (Al)GaN shell. This method also allows the growth of axial heterostructured nanowire or nanopyramid using techniques such as pulsed growth technique or continuous growth mode with modified growth parameters for e.g., lower V/III molar ratio and higher substrate temperature.

In more detail, the reactor must be evacuated after placing the sample, and is purged with $N_2$ to remove oxygen and water in the reactor. This is to avoid any damage to the graphene at the growth temperatures, and to avoid unwanted reactions of oxygen and water with the precursors. The total pressure is set to be between 50 and 400 Torr. After purging the reactor with $N_2$, the substrate is thermally cleaned under $H_2$ atmosphere at a substrate temperature of about 1200° C. The substrate temperature can then be set to a temperature suitable for the growth of the nanowire or nanopyramid in question. The growth temperature may be in the range 700 to 1200° C. The temperature employed is, however, specific to the nature of the material in the nanowire or nanopyramid. For GaN, a preferred temperature is 800 to 1150° C., e.g. 900 to 1100° C., such as 1100° C. For AlGaN the range is slightly higher, for example 900 to 1250° C., such as 1050 to 1250° C., e.g. 1250° C.

The metal organic precursors can be either trimethylgallium (TMGa), or triethylgallium (TEGa) for Ga, trimethylaluminum (TMAl) or triethylaluminum (TEAl) for Al, and trimethylindium (TMIn) or triethylindium (TEIn) for In. The precursors for dopants can be $SiH_4$ for silicon and bis(cyclopentadienyl)magnesium ($Cp_2Mg$) or bis(methylcyclopentadienyl)magnesium (($MeCp)_2Mg$) for Mg. The flow rate of TMGa, TMAl and TMIn can be maintained between 5 and 100 sccm. The $NH_3$ flow rate can be varied between 5 and 150 sccm.

In particular, the simple use of vapour-solid growth may enable nanowire or nanopyramid growth. Thus, in the context of MBE, simple application of the reactants, e.g. In and N, to the substrate without any catalyst can result in the formation of a nanowire or nanopyramid. This forms a further aspect of the invention which therefore provides the direct growth of a semiconductor nanowire or nanopyramid formed from the elements described above on a graphitic substrate. The term direct implies therefore the absence of a catalyst to enable growth.

Viewed from another aspect the invention provides a composition of matter comprising a plurality of group III-V nanowires or nanopyramids grown epitaxially on a graphitic substrate, preferably through the holes of a hole-patterned mask on said graphitic substrate, said nanowires or nanopyramids comprising:

an n-type doped region and a p-type doped region separated by an intrinsic region which acts as a multiple quantum well, said p-type doped region comprising an electron blocking layer.

Said regions can be represented by layers within a nanowire or nanopyramid or shells on a core to create the nanowire or nanopyramid. Thus, the invention further provides a plurality of radial group III-V nanowires or nanopyramids grown epitaxially on a graphitic substrate comprising, in this order, an n-type doped core with shell comprising an intrinsic multiple quantum well, an electron blocking shell (EBL), and p-type doped shell. The n-type doped region could include/comprise a hole blocking layer (single or multiple quantum barrier layers) to prevent the overflow of minority charge carriers (holes) into the n-type doped region.

Top Contact

In order to create a device of the invention, the top of the nanowires or nanopyramids needs to comprise a top electrode and, for the LED embodiment preferably a reflective layer. In some embodiments, these layers can be one in the same.

In one preferred embodiment, a top contact is formed using another graphitic layer. The invention then involves placing a graphitic layer on top of the formed nanowires or nanopyramids to make a top contact. It is preferred that the graphitic top contact layer is substantially parallel with the substrate layer. It will also be appreciated that the area of the graphitic layer does not need to be the same as the area of the substrate. It may be that a number of graphitic layers are required to form a top contact with a substrate with an array of nanowires or nanopyramids.

The graphitic layers used can be the same as those described in detail above in connection with the substrate. The top contact is graphitic, more especially it is graphene. This graphene top contact should contain no more than 10 layers of graphene or its derivatives, preferably no more than 5 layers (which is called as a few-layered graphene). Especially preferably, it is a one-atom-thick planar sheet of graphene.

The crystalline or "flake" form of graphite consists of many graphene sheets stacked together (i.e. more than 10 sheets). It is preferred if the top contact is 20 nm in thickness or less. Even more preferably, the graphitic top contact may be 5 nm or less in thickness.

When graphene contacts directly to the semiconductor nanowires or nanopyramids, it usually forms a Schottky contact which hinders the electrical current flow by creating a barrier at the contact junction. Due to this problem, the research on graphene deposited on semiconductors has been mainly confined to the use of graphene/semiconductor Schottky junctions.

Application of the top contact to the formed nanowires or nanopyramids can be achieved by any convenient method. Methods akin to those mentioned previously for transferring graphitic layers to substrate carriers may be used. The graphitic layers from Kish graphite, highly ordered pyrolytic graphite (HOPG), or CVD may be exfoliated by mechanical or chemical methods. Then they can be transferred into etching solutions such as HF or acid solutions to remove Cu (Ni, Pt, etc.) (especially for CVD grown graphitic layers) and any contaminants from the exfoliation process. The etching solution can be further exchanged into other solutions such as deionised water to clean the graphitic layers. The graphitic layers can then be easily transferred onto the formed nanowires or nanopyramids as the top contact. Again e-beam resist or photoresist may be used to support the thin graphitic layers during the exfoliation and transfer processes, which can be removed easily after deposition.

It is preferred if the graphitic layers are dried completely after etching and rinsing, before they are transferred to the top of the nanowire or nanopyramid arrays. To enhance the contact between graphitic layers and nanowires or nanopyramids a mild pressure and heat can be applied during this "dry" transfer.

Alternatively, the graphitic layers can be transferred on top of the nanowire or nanopyramid arrays, together with a solution (e.g. deionised water). As the solution dries off, the graphitic layers naturally form a close contact to underlying nanowires or nanopyramids. In this "wet" transfer method, the surface tension of the solution during the drying process might bend or knock out the nanowire or nanopyramid arrays. To prevent this, where this wet method is used, more robust nanowires or nanopyramids are preferably employed. Nanowires or nanopyramids having a diameter of >80 nm might be suitable. Alternatively, hole patterned substrates which support the vertical nanowire or nanopyramid structure could be used. One may also use the critical-point drying technique to avoid any damage caused by surface tension during the drying process. Another way to prevent this is to use supporting and electrically isolating material as fill-in material between nanowires or nanopyramids. The fill-in material needs to be transparent to the emitted light. We discuss the use of fillers below.

If there is a water droplet on a nanowire or nanopyramid array and attempts to remove it involve, for example a nitrogen blow, the water drop will become smaller by evaporation, but the drop will always try to keep a spherical form due to surface tension. This could damage or disrupt the nanostructures around or inside the water droplet.

Critical point drying circumvents this problem. By increasing temperature and pressure, the phase boundary between liquid and gas can be removed and the water can be removed easily.

Also doping of the graphitic top contact can be utilized. The major carrier of the graphitic top contact can be controlled as either holes or electrons by doping. It is preferable to have the same doping type in the graphitic top contact and in the semiconducting nanowires or nanopyramids.

It will be appreciated therefore that both top graphitic layer and the substrate can be doped. In some embodiments, the substrate and/or the graphitic layer is doped by a chemical method which involves with an adsorption of organic or inorganic molecules such as metal chlorides ($FeCl_3$, $AuCl_3$ or $GaCl_3$), $NO_2$, $HNO_3$, aromatic molecules or chemical solutions such as ammonia.

The surface of substrate and/or the graphitic layer could also be doped by a substitutional doping method during its growth with incorporation of dopants such as B, N, S, or Si.

Reflective Layer/Electrode

The device is provided with two electrodes. A first electrode is placed in contact with the graphene substrate. That electrode might be based on a metal element such as Ni, Au, Ti, or Al or a mixture thereof or a stack thereof, such as a stack Ti/Al/Ni/Au. Pd, Cu or Ag might also be used. Often the first electrode will be the n electrode. The electrode may be on either surface of the graphitic substrate, preferably on the same surface as the grown nanowires or nanopyramids.

A second electrode is placed as a top contact on top of the grown nanowires or nanopyramids. This electrode will often be the p electrode. It is preferred if this forms a good ohmic contact with the nanowires or nanopyramids. Suitable electrode materials include Ni, Ag, Pd and Cu. In particular, a Ni/Au stack could be used. This electrode might also act as a heat sink. As discussed below in further detail, the LED device of the invention is preferably in the form of a flip chip. The top contact electrode therefore sits at the bottom of the flip chip assembly. It is therefore preferred if the electrode either reflects light or is provided with a light reflective layer. The light reflective layer is ideally metallic. The light-reflective contact layer can be formed in several ways, although using a PVD (Physical Vapour Deposition) method and well-known mask techniques is the preferred method. The reflector is preferably made of aluminum or silver, but other metals or metal alloys may also be used. The purpose of the light-reflective layer is to prevent light from leaving the structure in a direction other than the preferred direction, and to focus the emitted light to one single direction. Additionally, the light-reflective layer may function as a top contact electrode to the nanowires or nanopyramids. The light emitted by the LED is channeled in a direction opposite to the reflective layer, i.e. out the top of the flip-chip. Where a graphene top contact layer is present, a light reflective layer is preferably additionally present.

The reflective layer needs to reflect light and may also act as a heat sink. Suitable thickness are 20 to 400 nm, such as 50 to 200 nm.

In the photodetector embodiment, there is no need to use a reflective layer but such a layer could be used, perhaps to reflect incoming light onto the nanowires or nanopyramids to enhance photodetection.

Filler

It is within the scope of the invention to use a filler to surround the flip chip assembly as long as the filler is transparent, e.g. to UV light. Filler may be present in the space between nanowires or nanopyramids and/or around the assembly as a whole. Different fillers might be used in the spaces between the nanowires or nanopyramids than in the assembly as a whole.

Applications

The invention relates to LEDs, in particular UV LEDs and especially UV-A, UV-B, or UV-C LEDs. The LEDs are preferred designed as a so called "flip chip" where the chip is inverted compared to a normal device.

The whole LED arrangement can be provided with contact pads for flip-chip bonding distributed and separated to reduce the average series resistance. Such a nanostructured LED can be placed on a carrier having contact pads corresponding to the position of p-contact pads and n-contact pads on the nanowire or nanopyramid LED chip and attached using soldering, ultrasonic welding, bonding or by the use of electrically conductive glue. The contact pads on the carrier can be electrically connected to the appropriate power supply lead of the LED package.

Nanowire-based LED devices as such, are usually mounted on a carrier that provides mechanical support and electrical connections. One preferred way to construct a LED with improved efficiency is to make a flip-chip device. A light reflective layer with high reflectivity is formed on top of the nanowires or nanopyramids. The initial support can be removed as a part of the process, leaving the substrate layer, to allow for the light to be emitted through said substrate layer which has formed a base for the nanowires or nanopyramids. If the support is transparent then of course there is no need to remove it. Emitted light directed towards the top of the nanowires or nanopyramids is reflected when it encounters the reflective layer, thus creating a clearly dominating direction for the light leaving the structure. This way of producing the structure allows for a much larger fraction of the emitted light to be guided in a desired direction, increasing the efficiency of the LED. The invention therefore enables the preparation of visible LEDs and UV LEDs.

The invention also relates to photodetectors in which the device absorbs light and generates a photocurrent. The light reflective layer may reflect light entering the device back on to the nanowires or nanopyramids for enhanced light detection.

The invention will now be further discussed in relation to the following non limiting examples and figures.

Figure 1:
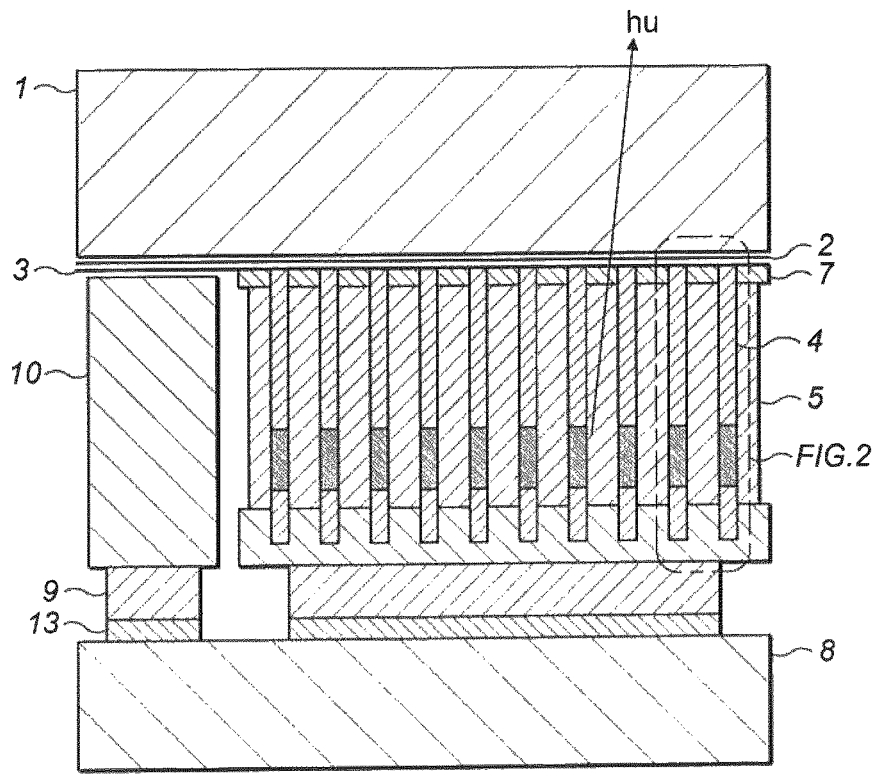
FIG. 1 shows a possible flip chip design. In use therefore, light is emitted through the top of the device (marked hu). Support 1 is preferably formed from fused silica (best option), quartz, silicon carbide, sapphire or AlN. The use of other transparent supports is also possible. The use of fused silica or quartz is preferred. In use, the support, if still present, is positioned upper most in the device and hence it is important that the support is transparent to the emitted light and thus allows light out of the device.

Layer 2, which is a preferred optional layer, is positioned between the support and the graphene layer 3 in order to reduce the sheet resistance of graphene. Suitable materials for layer 2 include inert nitrides such as hBN or a metallic nanowire network such as Ag nanowire network or metal grid.

Layer 3 is the graphene layer which can be one atomic layer thick or a thicker graphene layer, such as one which is up to 20 nm in thickness.

Nanowires 4 are grown from substrate layer 3 epitaxially. Ideally, the nanowires are formed from Al(In)GaN, AlN or GaN and are doped to create n-i-p or n-p junctions.

A filler 5 can be positioned between grown nanowires. A top electrode/light reflective layer 6 is positioned on top of nanowires 4. The light reflective layer may also be provided with a p-electrode comprising Ni or Au. In use, this layer reflects any light emitted by the device to ensure that the light is emitted through the top of the device opposite the reflective layer. This is the so called flip chip arrangement as the device is upside down compared to a conventional LED.

Electrode 10 is positioned on the graphene layer 3. That electrode might comprise Ti, Al, Ni or/and Au. The graphene layer may be provided with a mask 7 to allow growth of the nanowires in definitive positions on the graphene.

The whole device is soldered to conductive tracks/pads 13 on a submount 8 via solder layer 9.

When a forward current is passed across the device, visible or UV light, dependent on composition of matter, is generated in the nanowires and is emitted, possibly after reflecting off the reflective layer out the top of the device.

When a reverse current is passed across the device and when the device is exposed to visible or UV light, the nanowires absorb the visible or UV light, dependent on composition of matter, and converts it into current, working as a photodetector.

Figure 2:
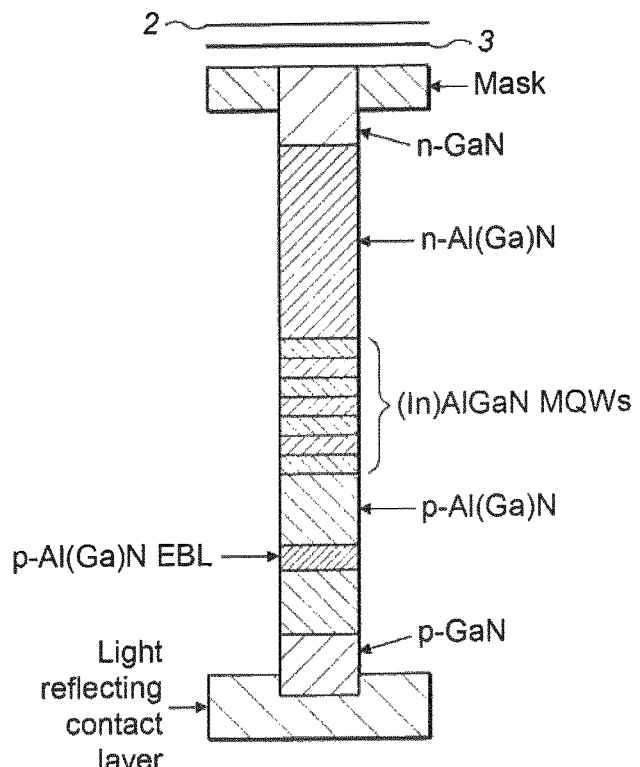

FIG. 2 shows a potential nanowire of the invention. The nanowire is provided with different components in an axial direction by variation of the elements being supplied during the growing phase. Initially, an n-type doped GaN material is deposited, followed by n-AlN or n-(Al)GaN. In the central section of the nanowire as shown are a series of multiple quantum wells formed from (In)(Al)GaN. There follows the p-doped region based on AlGaN or (Al)GaN, and an electron blocking layer based on p-Al(Ga)N and finally a p-GaN layer.

Figure 3:
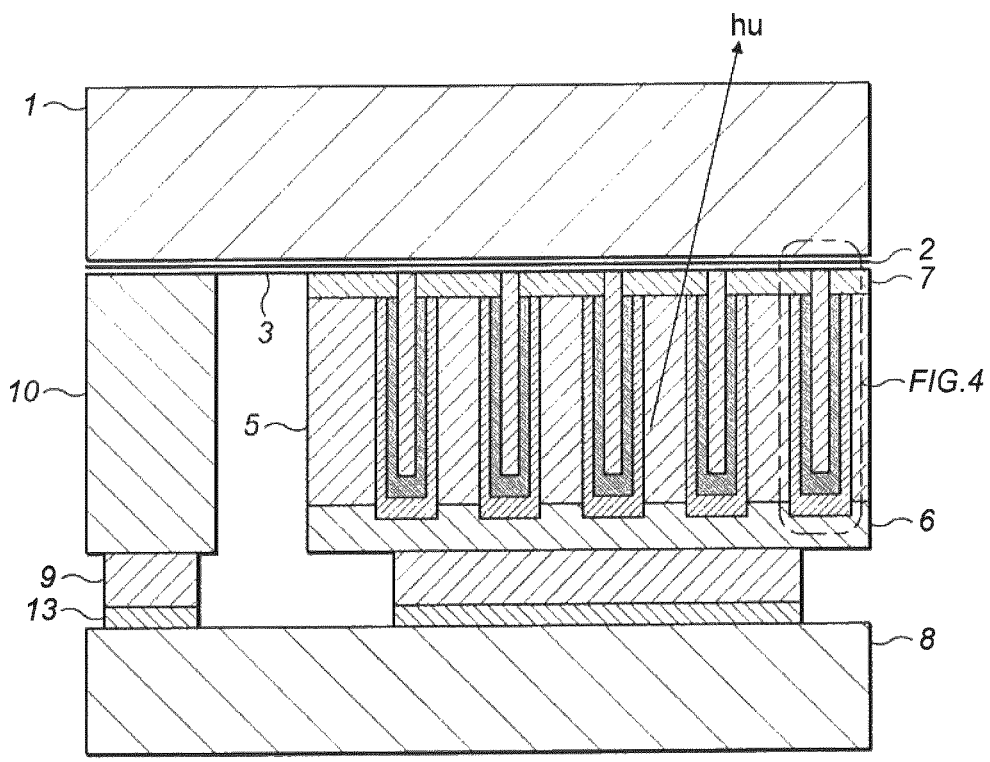

FIG. 3 shows an alternative chip design in which the nanowires are grown radially creating core shell structures. In use therefore, light is emitted through the top of the device (marked hu). Support 1 is preferably formed from fused silica or quartz. In use, the support, if still present, is positioned upper most in the device and hence it is important that the support is transparent to the emitted light and thus allows light out of the device.

Layer 2, which is a preferred intermediate layer, is positioned between the support and the graphene layer 3 in order to reduce the sheet resistance of graphene. Suitable materials for layer 2 include inert nitrides such as hBN or a metallic nanowire network such as silver nanowire network or metal grid.

Layer 3 is the graphene layer which can be one atomic layer thick or a thicker graphene layer, such as one which is up to 20 nm in thickness.

Nanowires 4 are grown from layer 3 epitaxially. Ideally, the nanowires are formed from Al(In)GaN, AlN or GaN and are doped to create n-i-p or n-p junctions. The graphene can be provided with a mask layer 7.

A filler 5 can be positioned between grown nanowires. A top electrode/light reflective layer 6 is positioned on top of nanowires 4. The light reflective layer may also be provided with a p-electrode comprising Ni or/and Au or may itself be an electrode. In use, this layer reflects any light emitted by the device to ensure that the light is emitted through the top of the device opposite the reflective layer. This is the so called flip chip arrangement as the device is upside down compared to a conventional LED.

Electrode 10 is positioned on the graphene layer 3. When a forward current is passed across the device, visible or UV light, dependent on composition of matter, is generated in the nanowires and is emitted, possibly after reflecting off the reflective layer out the top of the device.

The whole device is soldered to conductive tracks/pads 13 on a submount 8 via solder layer 9.

When a reverse current is passed across the device and when the device is exposed to visible or UV light, the nanowires absorb the visible or UV light, dependent on composition of matter, and converts it into current, working as a photodetector.

Figure 4:
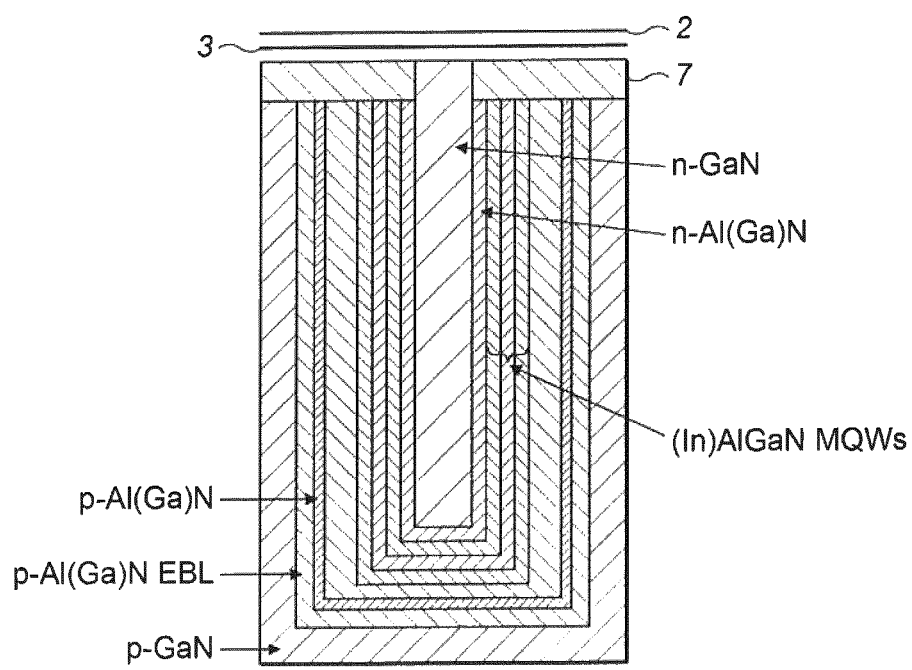

FIG. 4 shows a nanowire grown radially but having the same components as those of FIG. 2 in a shell arrangement. The nanowire is provided with different components in a radial direction by variation of the elements being supplied during the growing phase. Initially, an n-doped GaN material is deposited, followed by n-AlN or n-(Al)GaN. In the central shell of the nanowire as shown are a series of multiple quantum wells formed from (In)(Al)GaN. There follows the p-doped region based on Al(Ga)N, and an electron blocking shell based on p-Al(Ga)N and finally a p-GaN shell.

Figure 5:
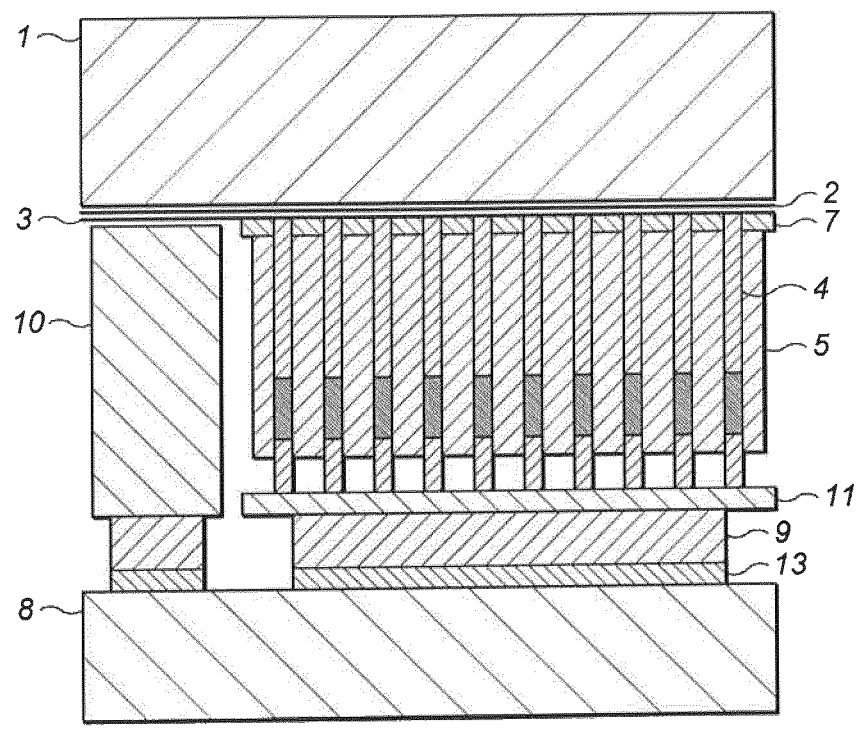

FIG. 5 shows a photodetector. In use therefore, light is accepted through the top of the device. Support 1 is preferably formed from fused silica, quartz, silicon carbide or AlN. The use of fused silica or quartz is preferred. In use, the support, if still present, is positioned upper most in the device and hence it is important that the support is transparent to the accepted light and thus allows light in to the device.

Layer 2, which is a preferred optional layer, is positioned between the support and the graphene layer 3 in order to reduce the sheet resistance of graphene. Suitable materials for layer 2 include inert nitrides such as hBN or a metallic nanowire network such as Ag nanowire network or metal grid.

Layer 3 is the graphene layer which can be one atomic layer thick or a thicker graphene layer, such as one which is up to 20 nm in thickness.

Nanowires 4 are grown from substrate layer 3 epitaxially. Ideally, the nanowires are formed from Al(In)GaN, AlN or GaN and are doped to create n-i-p or n-p junctions.

A filler 5 can be positioned between grown nanowires. A top electrode layer 11 is positioned on top of nanowires 4. This electrode is ideally a p-electrode comprising Ni or Au.

Electrode 10 is positioned on the graphene layer 3. The graphene layer may be provided with a mask 7 to allow growth of the nanowires in definitive positions on the graphene.

The whole device is soldered to conductive tracks/pads 13 on a submount 8 via solder layer 9.

When a reverse current is passed across the device and when the device is exposed to visible or UV light, the nanowires absorb the visible or UV light, dependent on composition of matter, and converts it into current, working as a photodetector.

Figure 6A:
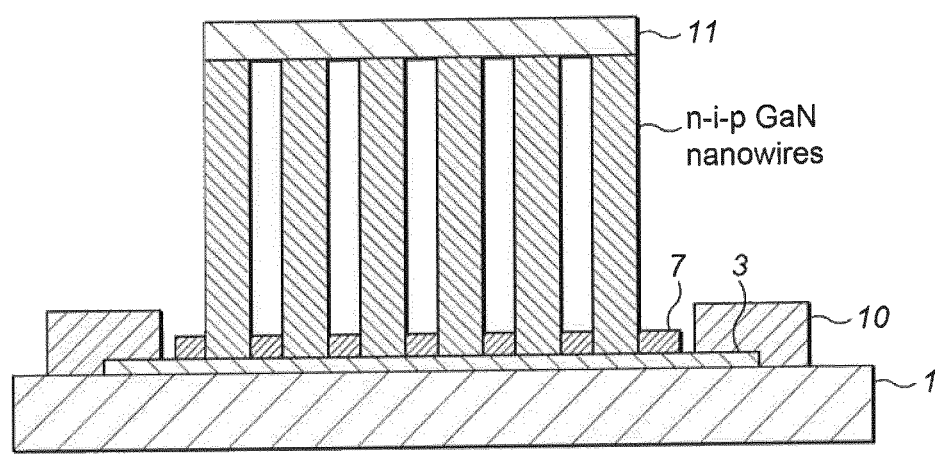
Figure 6B:
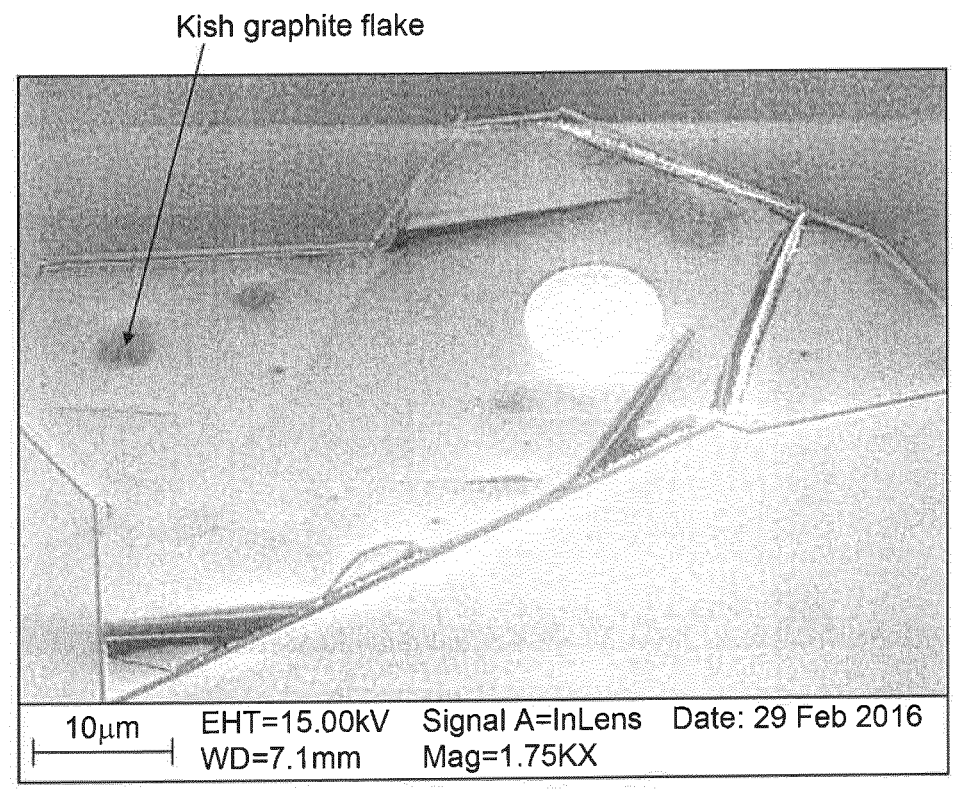
Figure 6C:
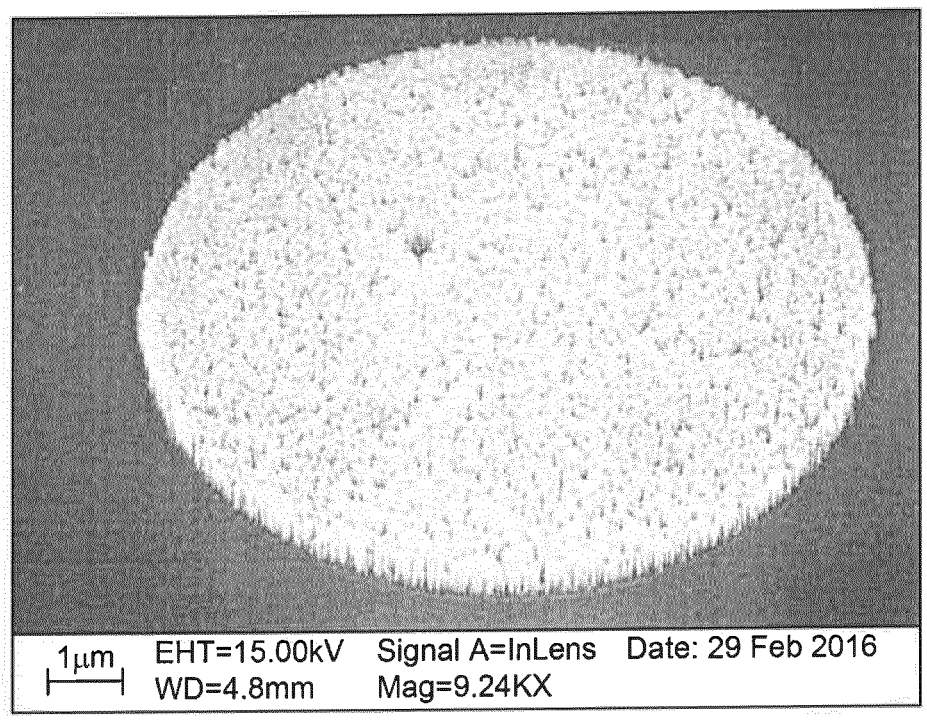

FIG. 6: (a) Schematic diagram showing the growth of nanowires on graphite flake and the top and bottom contacts to the nanowires. Tilted view SEM image (b) and high-resolution SEM image (c) of selectively grown GaN nanowires on multi-layer graphene flakes by MBE.

The graphite flake 3 (or graphene) is transferred on a support substrate such as fused silica substrate 1. A mask material 7 such as $Al_2O_3$ and $SiO_2$ is deposited on the graphite flake. A big hole of 10 µm in diameter is etched in the mask material using photolithography such that the graphite surface is exposed in the hole. The sample is transferred into the MBE chamber for the nanowire growth. The substrate is heated to the growth temperature and a nucleation layer consisting of Al and AlN is deposited on the substrate, which is followed by the initiation of the (Al)GaN nanowires/nanopyramids growth.

Figure 7A:
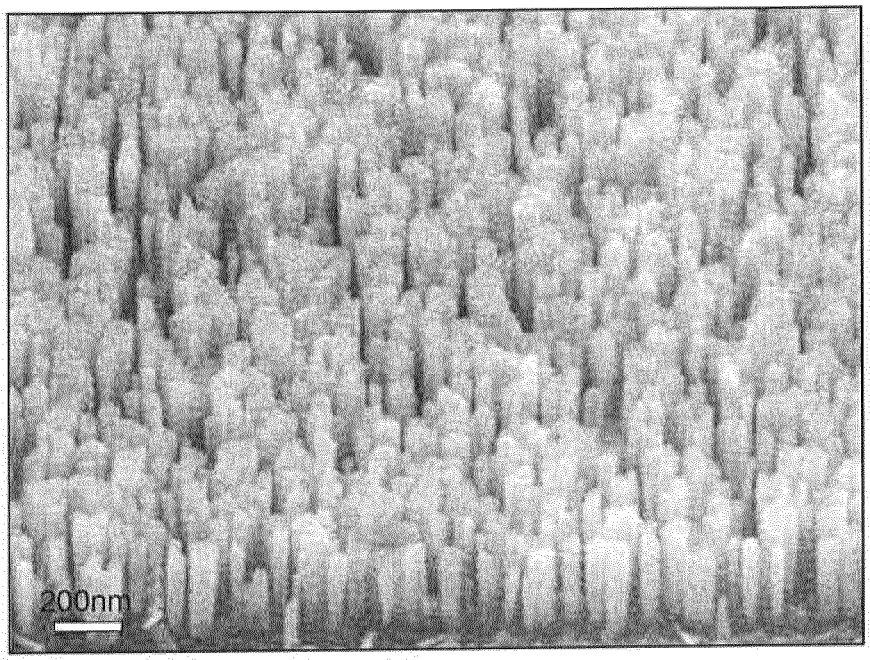
Figure 7B:
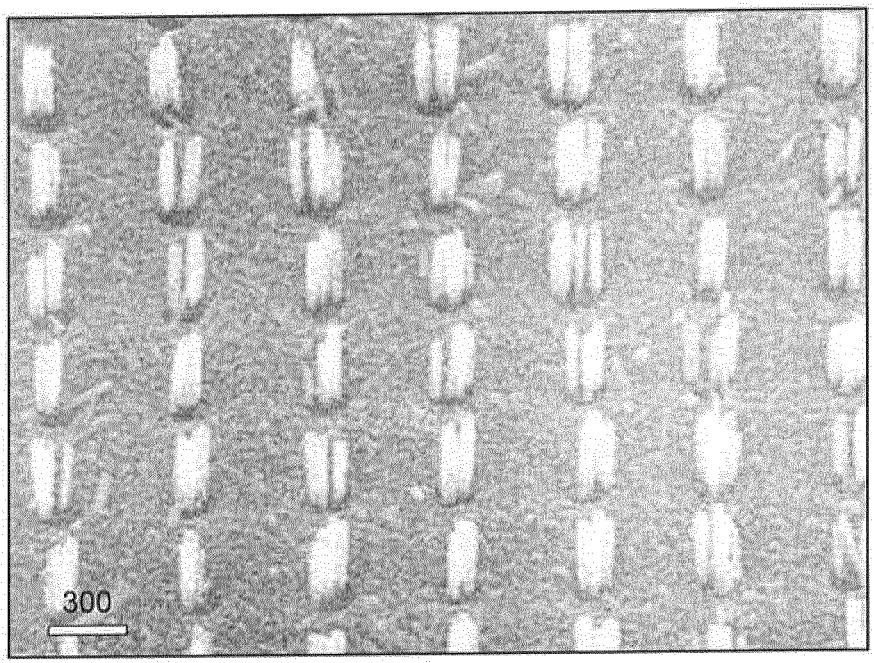

FIG. 7: Tilted view SEM images of GaN nanowires grown on (a) multi-layer graphene flakes by MBE. (b) GaN nanowires grown on hole patterned multi-layer graphene flakes by MBE.

The graphite flake (or graphene) is transferred on a support substrate such as fused silica substrate. A mask material such as $Al_2O_3$ and $SiO_2$ is deposited on the graphite flake. A big hole of 1 µm in diameter and several small holes of ~80 nm in diameter is etched in the mask material using e-beam lithography such that the graphite surface is exposed in the holes. The sample is transferred into the MBE chamber for nanowire growth. The substrate is heated to the growth temperature and a nucleation layer consisting of Al and AlN is deposited on the substrate, which is followed by the initiation of the (Al)GaN nanowires are grown. FIG. 7 shows the tilted view SEM image of GaN nanowires grown in the big hole region (a) and small hole patterns (b).

Figure 8A:
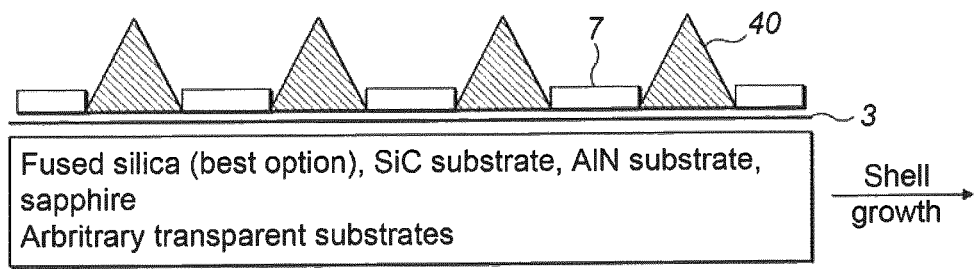
Figure 8B:
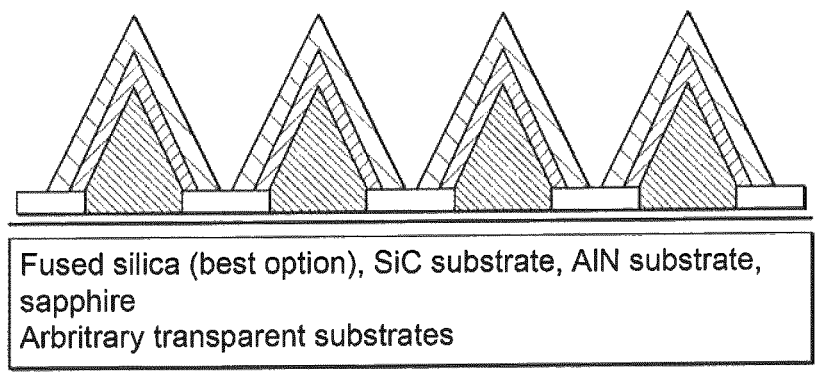

FIGS. 8a and b shows the growth of nanopyramids. Support 1 is preferably formed from fused silica (best option), quartz, silicon carbide, sapphire or AlN. The use of other transparent supports is also possible. The use of fused silica or quartz is preferred. In use, the support, if still present, is positioned upper most in the device and hence it is important that the support is transparent to the emitted light and thus allows light out of the device.

Layer 3 is the graphene layer which can be one atomic layer thick or a thicker graphene layer, such as one which is up to 20 nm in thickness.

Nanopyramids 40 are grown from layer 3 epitaxially. Ideally, the nanopyramids are formed from Al(In)GaN, AlN or GaN and are doped to create n-i-p or n-p junctions. A core shell nanopyramid can be grown be changing the nature of the flux supplied during the growth period.

A filler 5 (not shown) can be positioned between grown nanopyramids. A top electrode/light reflective layer (not shown) can be positioned on top of nanopyramids. The light reflective layer may also be provided with a p-electrode comprising conducting materials such as Ni or Au. In use, this layer reflects any light emitted by the device to ensure that the light is emitted through the top of the device opposite the reflective layer. This is the so called flip chip arrangement as the device is upside down compared to a conventional LED.

The graphene layer may be provided with a mask 7 to allow growth of the nanopyramids in definitive positions on the graphene.

Figure 9A:
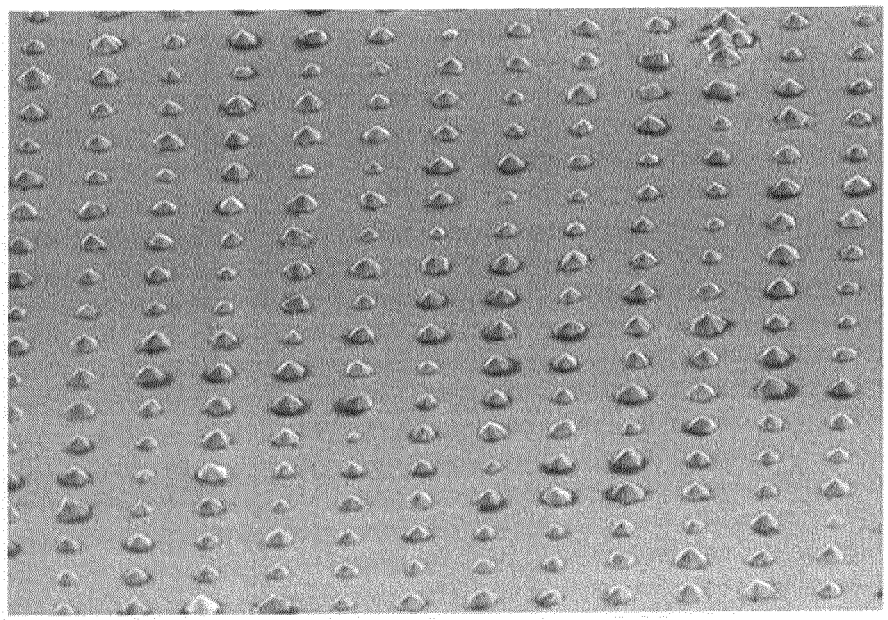
Figure 9B:
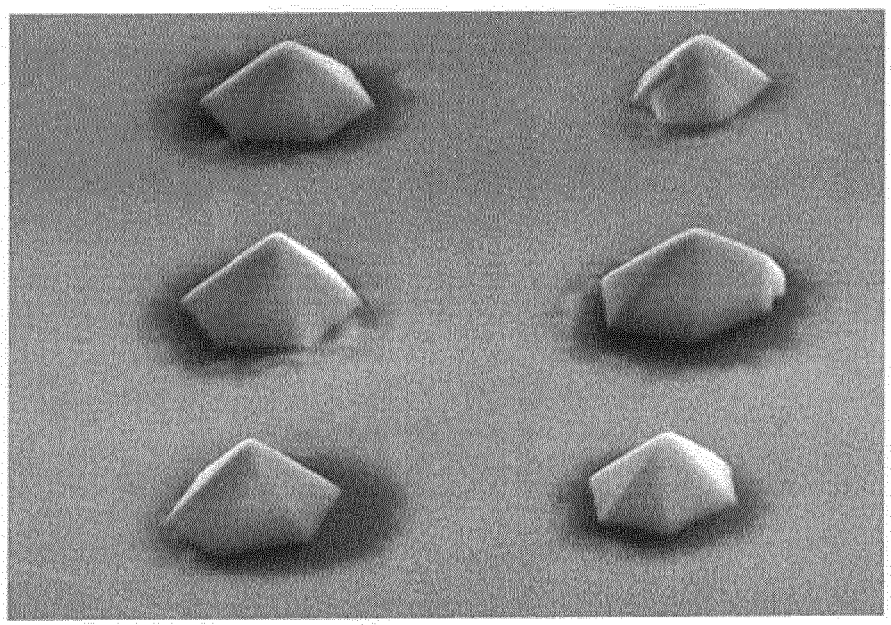

FIG. 9: (a) Low magnification and (b) High magnification tilted view SEM images of GaN nanopyramids grown on patterned single or double layer graphene by MOVPE.

A graphene layer is transferred on a support substrate such as fused silica substrate. A mask material such as $Al_2O_3$ and $SiO_2$ is deposited on the graphene. Several small holes of ~100 nm in diameter and pitch in the range between 0.5 and 5 μm are etched in the mask material using e-beam lithography such that the graphene surface is exposed in the holes. The sample is then transferred into the MOVPE reactor for the nanopyramid growth. The substrate is heated to the growth temperature and a nucleation layer consisting of AlGaN is deposited on the substrate, which is followed by the growth of the (Al)GaN nanopyramids. FIG. 9 shows the tilted view SEM image of patterned GaN nanopyramids grown on graphene.

Figure 10:
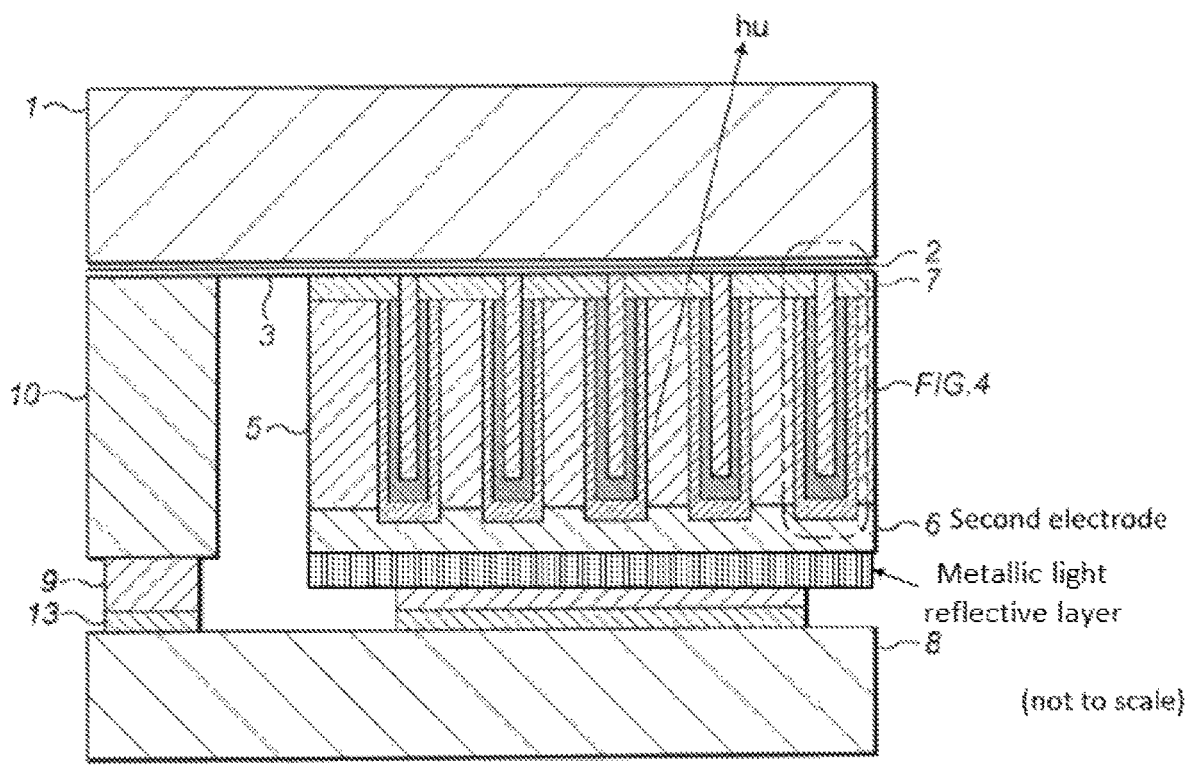

FIG. 10 shows an alternative chip design in which the nanowires are grown radially creating core shell structures. In use therefore, light is emitted through the top of the device (marked hu). Support 1 is preferably formed from fused silica or quartz. In use, the support, if still present, is positioned upper most in the device and hence it is important that the support is transparent to the emitted light and thus allows light out of the device.

Layer 2, which is a preferred intermediate layer, is positioned between the support and the graphene layer 3 in order to reduce the sheet resistance of graphene. Suitable materials for layer 2 include inert nitrides such as hBN or a metallic nanowire network such as silver nanowire network or metal grid.

Layer 3 is the graphene layer which can be one atomic layer thick or a thicker graphene layer, such as one which is up to 20 nm in thickness.

Nanowires 4 are grown from layer 3 epitaxially. Ideally, the nanowires are formed from Al(In)GaN, AlN or GaN and are doped to create n-i-p or n-p junctions. The graphene can be provided with a mask layer 7.

A filler 5 can be positioned between grown nanowires. A second electrode 6 is positioned on top of nanowires 4. A metallic light reflective layer is also provided in contact with the second electrode. In use, this layer reflects any light emitted by the device to ensure that the light is emitted through the top of the device opposite the reflective layer. This is the so called flip chip arrangement as the device is upside down compared to a conventional LED.

Electrode 10 is positioned on the graphene layer 3. When a forward current is passed across the device, visible or UV light, dependent on composition of matter, is generated in the nanowires and is emitted, possibly after reflecting off the reflective layer out the top of the device.

The whole device is soldered to conductive tracks/pads 13 on a submount 8 via solder layer 9.

When a reverse current is passed across the device and when the device is exposed to visible or UV light, the nanowires absorb the visible or UV light, dependent on composition of matter, and converts it into current, working as a photodetector.

The invention claimed is:

1. A device comprising:
   a plurality of nanowires or nanopyramids grown on a graphitic substrate, the plurality of nanowires or nanopyramids having a p-n or p-i-n junction and each of the plurality of nanowires having a top and a bottom, the bottom of each of the plurality of nanowires or nanopyramids being in contact with the graphitic substrate, and the plurality of nanowires or nanopyramids comprising at least one group III-V compound semiconductor;
   a first electrode in electrical contact with the graphitic substrate;
   a planar second electrode having a thickness of 20 nm or less in contact with the top of at least a portion of the plurality of nanowires or nanopyramids; and
   a metallic light reflective layer having a thickness of from 20 nm to 400 nm in contact with the planar second electrode;
   wherein the device comprises a flip chip light emitting diode that emits light and the light is emitted in a direction substantially opposite to the metallic light reflective layer.

2. The device of claim 1, wherein the device further comprises a hole-patterned mask deposited on the graphitic substrate, the hole-patterned mask comprising a plurality of holes, and wherein the plurality of nanowires or nanopyramids are grown through the holes of the hole-patterned mask on the graphitic substrate.

3. The device of claim 1, wherein the plurality of nanowires or nanopyramids are grown epitaxially on the graphitic substrate.

4. The device of claim 1, wherein the graphitic substrate is graphene.

5. The device of claim 1, wherein the graphitic substrate has a thickness of 20 nm or less.

6. The device of claim 1, wherein the graphitic substrate is graphene having up to 10 atomic layers.

7. The device of claim 1, wherein the device further comprises a support adjacent the graphitic substrate, opposite to the plurality of nanowires or nanopyramids grown on the graphitic substrate.

8. The device of claim 7, wherein the support is fused silica or quartz.

9. The device of claim 1, wherein the device further comprises an intermediate layer adjacent the graphitic substrate, opposite to the plurality of nanowires or nanopyramids grown on the graphitic substrate.

10. The device of claim 9, wherein the intermediate layer is hexagonal boron nitride (hBN), a metal grid, or a Ag nanowire network.

11. The device of claim 1, wherein the plurality of nanowires or nanopyramids comprise GaN, AlGaN, InGaN, or AlInGaN.

12. The device of claim 1, wherein the plurality of nanowires or nanopyramids comprise a multiple quantum well.

13. The device of claim 1, wherein the plurality of nanowires or nanopyramids contain an electron blocking layer.

14. The device of claim 1, wherein the device emits light in the UV spectrum.

15. The device of claim 1, wherein the device comprises a plurality of nanowires and the p-n or p-i-n junction within each of the plurality of nanowires is axial.

16. The device of claim 1, wherein the plurality of nanowires or nanopyramids comprise a tunnel junction.

17. The device of claim 1, wherein the plurality of nanowires or nanopyramids comprise an (Al)GaN/Al(Ga)N superlattice.

18. The device of claim 1, wherein the plurality of nanowires or nanopyramids comprise AlGaN with an increasing or decreasing concentration of Al along a direction in each of the plurality of nanowires or nanopyramids.

19. The device of claim 1, wherein the plurality of nanowires or nanopyramids are doped using Mg or Be.

20. The device of claim 1, wherein each of the plurality of nanowires or nanopyramids is separated by space, and the space between each of the plurality of nanowires or nanopyramids is filled by a supporting and electrically isolating filler material transparent to the light emitted from the device.

21. The device of claim 1, wherein the metallic light reflective layer has a thickness of at least 50 nm.

22. The device of claim 1, wherein the planar second electrode is graphitic.

23. The device of claim 1, wherein the light is not emitted in all directions.

24. The device of claim 1, wherein the light is emitted in a single direction.

25. A device comprising:
a plurality of nanowires or nanopyramids grown on a graphitic substrate, the plurality of nanowires or nanopyramids having a p-n or p-i-n junction and each of the plurality of nanowires having a top and a bottom, the bottom of each of the plurality of nanowires or nanopyramids being in contact with the graphitic substrate, and the plurality of nanowires or nanopyramids comprising at least one group III-V compound semiconductor;
a first electrode in electrical contact with the graphitic substrate;
a planar second electrode having a thickness of 20 nm or less in contact with the top of at least a portion of the plurality of nanowires or nanopyramids; and
a metallic light reflective layer having a thickness of 20 to 400 nm in contact with the planar second electrode;
wherein the metallic light reflective layer reflects incoming light onto at least a portion of the plurality of nanowires or nanopyramids; and
wherein the device comprises a flip chip photodetector device and wherein in use light is absorbed in the device.

26. The device of claim 25, wherein each of the plurality of nanowires or nanopyramids is separated by space and the space between each of the plurality of nanowires or nanopyramids is filled by a supporting and electrically isolating filler material transparent to visible and/or UV light entering into the device.

27. The device of claim 25, wherein the device absorbs light in the UV spectrum.

* * * * *